United States Patent
Singh et al.

(10) Patent No.: US 11,304,329 B2
(45) Date of Patent: Apr. 12, 2022

(54) MOVABLE INLET FOR A FAN

(71) Applicant: Intel Corporation, Santa Clara, CA (US)

(72) Inventors: Bijendra Singh, Bangalore (IN); Prakash Kurma Raju, Bangalore (IN); Samarth Alva, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/722,275

(22) Filed: Dec. 20, 2019

(65) Prior Publication Data

US 2020/0128692 A1     Apr. 23, 2020

(51) Int. Cl.
*H05K 7/20*     (2006.01)

(52) U.S. Cl.
CPC ..... *H05K 7/20145* (2013.01); *H05K 7/20972* (2013.01)

(58) Field of Classification Search
CPC ...... G06F 1/203; G06F 1/1616; G06F 1/1681; G06F 1/20; G06F 1/206; H05K 7/20172; H05K 7/20145; H05K 7/20136; H05K 7/20209; H05K 7/20972; H05K 7/14; H05K 7/20; H05K 7/20154; H05K 7/20163; H05K 7/2019
USPC .... 361/679.48, 695, 679.08, 679.11, 679.46, 361/679.55, 692, 694, 697
See application file for complete search history.

(56) References Cited

U.S. PATENT DOCUMENTS

| | | | |
|---|---|---|---|
| 6,496,369 B2 * | 12/2002 | Nakamura | G06F 1/1616 165/80.3 |
| 6,542,360 B2 * | 4/2003 | Koizumi | G06F 1/1632 165/80.3 |
| 10,423,200 B1 | 9/2019 | North et al. | |
| 2008/0218955 A1 | 9/2008 | Nishizawa | |
| 2010/0214743 A1 | 8/2010 | Huang et al. | |
| 2016/0085273 A1 | 3/2016 | Delano et al. | |
| 2016/0334835 A1 * | 11/2016 | Tamura | G06F 1/1616 |
| 2018/0070472 A1 * | 3/2018 | Aiello | G06F 1/20 |

FOREIGN PATENT DOCUMENTS

| | | |
|---|---|---|
| CN | 113009991 A | 6/2021 |
| EP | 3865978 A1 | 8/2021 |
| WO | 2011006301 A1 | 1/2011 |

OTHER PUBLICATIONS

Screenshot for evidence (Year: 2008).*
European Office Action in European Patent Application No. 20197338.5 dated Mar. 17, 2021, 2 pages.
Extended European Search Report in European Patent Application No. 20197338.5 dated Jul. 19, 2021, 8 pages.

* cited by examiner

*Primary Examiner* — Mandeep S Buttar
(74) *Attorney, Agent, or Firm* — Patent Capital Group

(57) ABSTRACT

Particular embodiments described herein provide for an electronic device that can be configured to include a first housing, a second housing, where the second housing includes a fan, an inlet, and actuators, and a hinge, where the hinge rotatably couples the first housing to the second housing. When the first housing is rotated over the inlet, the actuators lower the inlet to create a gap between the inlet and the first housing. In some examples, the inlet includes slats and when the first housing is rotated over the inlet, a distance between each of the slats increases from a first distance to a second distance.

17 Claims, 15 Drawing Sheets

MOVABLE INLET FOR A FAN

TECHNICAL FIELD

This disclosure relates in general to the field of computing, and more particularly, to a movable inlet for a fan.

BACKGROUND

End users have more electronic device choices than ever before. A number of prominent technological trends are currently afoot (e.g., more computing devices, more devices that can change into different configurations, etc.), and these trends are changing the electronic device landscape. Some of the technological trends can place increasing performance demands on the system. The increasing performance demands can cause thermal increases of the system. The thermal increases can cause a reduction in device performance, a reduction in the lifetime of a device, and delays in data throughput.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

Figure 1A:
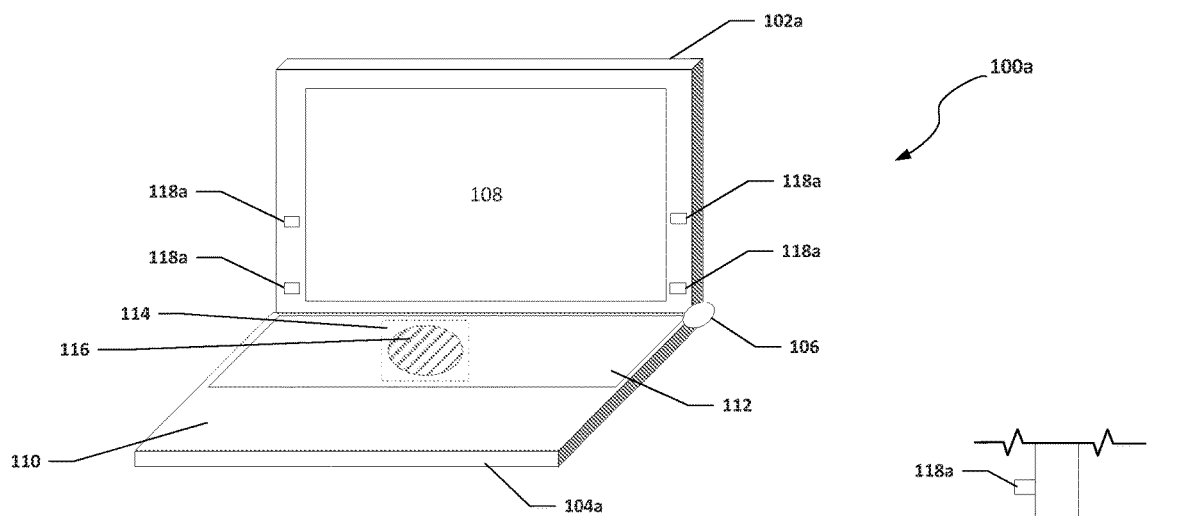
FIG. 1A is a simplified block diagram of an electronic device to enable a movable inlet for a fan, in accordance with an embodiment of the present disclosure.

The FIGURES of the drawings are not necessarily drawn to scale, as their dimensions can be varied considerably without departing from the scope of the present disclosure.

DETAILED DESCRIPTION

Example Embodiments

The following detailed description sets forth examples of apparatuses, methods, and systems relating to enabling a movable inlet for a fan. As used herein, the term "fan" includes an air mover, fluid mover, water mover (e.g., a pump), or some other device that creates a flow within a fluid. Features such as structure(s), function(s), and/or characteristic(s), for example, are described with reference to one embodiment as a matter of convenience; various embodiments may be implemented with any suitable one or more of the described features.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials, and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

The terms "over," "under," "below," "between," and "on" as used herein refer to a relative position of one layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "directly on" a second layer is in direct contact with that second layer. Similarly, unless explicitly stated otherwise, one feature disposed between two features may be in direct contact with the adjacent features or may have one or more intervening layers.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment. The appearances of the phrase "for example," "in an example," or "in some examples" are not necessarily all referring to the same example.

FIG. 1A is a simplified block diagram of an electronic device 100a configured with a movable inlet for a fan, in accordance with an embodiment of the present disclosure. In an example, electronic device 100a can include a first housing 102a and a second housing 104a. First housing 102a can be rotatably coupled to second housing 104a using a hinge 106. First housing 102a can include a display 108 and tabs 118a. Second housing 104a can include a keyboard portion 110, an inlet portion 112, and a fan 114. Keyboard portion 110 can include one or more user input devices (e.g., keyboard, touchpad, trackpad, trackball, joystick, etc.). Inlet portion 112 can include inlet 116. In an example, fan 114 may be an air mover, fluid mover, or some other device that creates a flow within a fluid. In a specific example, fan 114 may be a dish fan. The term "dish fan" includes a radial fan or caseless fan. Second housing 104a can include one or more inlets in addition to inlet 116. For example, if fan 114 is a dish fan, second housing 104 can include bottom inlet 172.

Figure 1B:
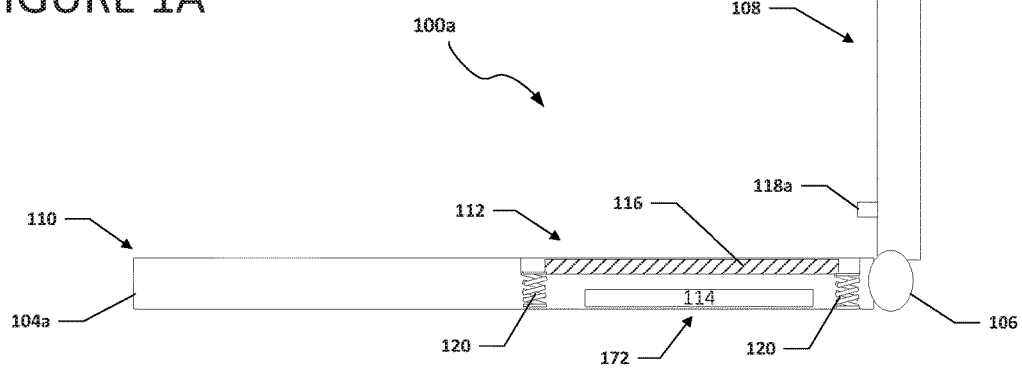
FIG. 1B is a simplified block diagram of an electronic device to enable a movable inlet for a fan, in accordance with an embodiment of the present disclosure.

Turning to FIG. 1B, FIG. 1B is a simplified block diagram side view of electronic device 100a configured with a movable inlet for a fan, in accordance with an embodiment of the present disclosure. Electronic device 100a can include first housing 102a and second housing 104a. First housing 102a can be rotatably coupled to second housing 104a using hinge 106. First housing 102a can include display 108 and tabs 118a. Second housing 104a can include keyboard portion 110, inlet portion 112, fan 114, and actuators 120. Inlet portion 112 can include inlet 116.

As illustrated in FIGS. 1A and 1B, electronic device 100a is in an open configuration. In the open configuration, first housing 102a has been rotated away from second housing 104a and airflow into inlet 116 is unobstructed. Fan 114 can use the air collected through inlet 116 (and any other inlets to fan 114) to help cool electronics, components, elements, etc. of electronic device 100a. Actuators 120 may be springs or some other mechanism that can push inlet portion 112 away from fan 114 such that inlet portion 112 is in relatively the same plane as keyboard portion 110. In an example, actuators 120 push or otherwise cause inlet portion 112 to be relatively even with keyboard portions 110 such that second housing 104 has a relatively flat profile.

Figure 1C:
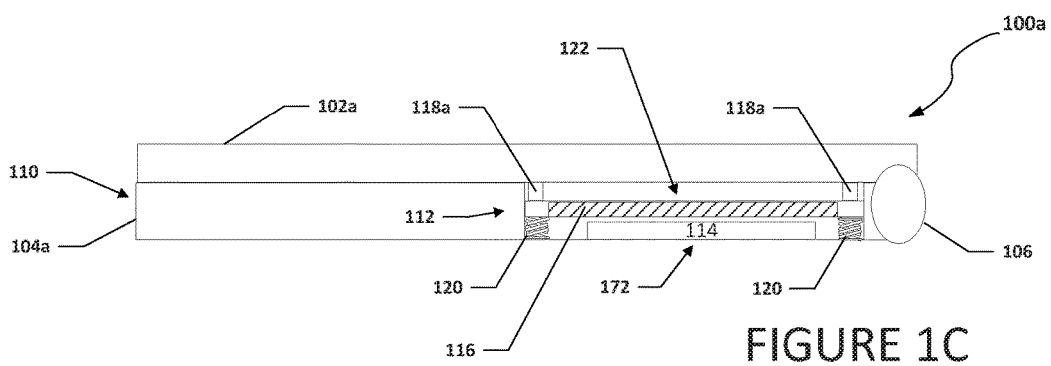
FIG. 1C is a simplified block diagram of an electronic device to enable a movable inlet for a fan, in accordance with an embodiment of the present disclosure.

Turning to FIG. 1C, FIG. 1C is a simplified block diagram of electronic device 100a configured with a movable inlet for a fan, in accordance with an embodiment of the present disclosure. Electronic device 100a can include first housing 102a and second housing 104a. First housing 102a can be rotatably coupled to second housing 104a using hinge 106. First housing 102a can include display 108 and tabs 118a. Second housing 104a can include keyboard portion 110, inlet portion 112, fan 114, and actuators 120. Inlet portion 112 can include inlet 116.

As illustrated in FIG. 1C, electronic device 100a is in a closed configuration. In the closed configuration, first housing 102a has been rotated towards second housing 104a. As first housing 102a is rotated towards second housing 104a, tabs 118a come into contact with inlet portion 112 and create a downward force on inlet portion 112. The downward force on inlet portion 112 from tabs 118a causes actuators 120 to compress and allow inlet portion 112 to move out of the plane of keyboard portion 110 and create a gap 122 between inlet portion 112 and first housing 102a. Gap 122 allows air to flow into inlet 116 and to fan 114. If inlet portion 112 did not move out of the plane of keyboard portion 110 and create gap 122 between inlet portion 112 and first housing 102a, then first housing 102a would be directly over inlet 116 or relatively close to inlet and would restrict the airflow into inlet 116 and cause a performance reduction by fan 114.

Gap 122 can provide a channel to allow air to flow through inlet 116 and to fan 114. In some examples, the inlet open area ratio (OAR) for inlet 116 is also increased to improve the air intake. For example, the distance between each slat in inlet 116 may be about one (1) millimeter (mm) or less when electronic device 100a is in an open configuration (as illustrated in FIGS. 1A and 1B) to comply with Underwriter Laboratories (UL) standards. When electronic device 100a is in a close configuration (as illustrated in FIG. 1C), the distance between each slat in inlet 116 may be greater than about one (1) millimeter (mm). By creating gap 122 when electronic device 100a is in a close configuration (as illustrated in FIG. 1C) and/or increasing the OAR of inlet 116, more air can be collected by fan 114 and used to cool electronic device 100a. This allows air to be collected by fan 114, even when electronic device 100a is in a close configuration.

It is to be understood that other embodiments may be utilized and structural changes may be made without departing from the scope of the present disclosure. Substantial flexibility is provided by electronic device 100a in that any suitable arrangements and configuration may be provided without departing from the teachings of the present disclosure.

For purposes of illustrating certain example techniques of electronic device 100a, the following foundational information may be viewed as a basis from which the present disclosure may be properly explained. End users have more media and communications choices than ever before. A number of prominent technological trends are currently afoot (e.g., more computing devices, more online video services, etc.) Some of the technological trends can place increasing performance demands on the system. The increasing performance demands can cause thermal increases in the system. The thermal increases can cause a reduction in device performance, a reduction in the lifetime of a device, and delays in data throughput.

To try and mitigate the thermal increases, some systems use an active heat sink. An active heat sink is a device that uses a fan to actively divert heat away from components by circulating air to cool one or more heat sources or conduct heat away from the one or more heat sources. One type of active heat sink is a dish fan. However, one key constraint of a dish fan is that most dish fans rely equally on both top and bottom inlets for the air flow to the dish fan. This means the amount of air flow to the dish fan will degrade drastically if the top inlet is blocked or the airflow to the top inlet is restricted. More specifically, if the amount of air flow to the fan is reduced, the amount of cooling the dish fan can achieve is reduced, and therefore, the cooling capacity of the system and the system performance is reduced. In an illustrative example, the top inlet can be blocked when a user wants to use an external display and keeps the electronic device in a closed configuration to avoid obstruction of the external display by the display of the electronic device. What is needed is a movable inlet for a fan that does not allow for the top inlet to be blocked when an electronic device is in a close configuration.

A movable inlet for a fan, as outlined in FIGS. 1A-1C, can be used to help resolve these issues (and others). For example, an electronic device (e.g., electronic device 100a) can be configured to include an inlet portion (e.g., inlet portion 112). The inlet portion can include one or more inlets (e.g., inlet 116) for a fan (e.g., fan 114) and the inlet portion can be configured to move to create a gap (e.g., gap 122) when the electronic device is in a closed configuration. More specifically, the inlet portion can translate vertically in a "Z" direction in a chassis base (e.g., second housing 104a) to create a channel to facilitate air flow through the top inlet and to "unblock" the top inlet when a lid (e.g., first housing 102a) is closed (e.g., for connected external display usage). In some examples, a locking system for the inlet portion can be used to help prevent accidental movement of the inlet portion under normal condition.

In an illustrative example, the inlet portion can be pushed or otherwise moved up by actuators when the electronic device is in an open configuration to allow enough space for motor/blade wobbling clearance between the fan and the inlet and to meet pogo test (mechanical loading) requirements. In a specific example, the actuators include a spring-loaded plunger. The spring-loaded plunger can push the inlet portion upwards to a desired location (e.g., in relatively the same plane as the keyboard). A locking mechanism can be activated to help prevent the accidental movement of the inlet portion. In a specific example, the locking mechanism is a cam linked to the hinge that can engage under the inlet portion and help to prevent the inlet portion from going down.

When the electronic device is in a closed configuration, the inlet is pushed or otherwise moved down to create a channel between the closed lid (e.g., a display, secondary display, etc.) and the top inlet, allowing air flow from/into the top inlet. For example, when the lid is closed, a spring-loaded mechanism under the inlet portion can become compressed as the force due to self-weight of the closed lid is applied on the inlet portion. Gaps and clearances are provided to account for fan wobbling only and pogo test requirements are not in-force for closed lid configurations. In some examples, the region under and above the fan is made with relatively thin material (e.g., 0.4 mm stainless steel) as compared to the rest of an aluminum alloy chassis (e.g., 0.8 mm aluminum alloy), creating additional space for the movement of the inlet portion without impacting the system Z-stack. The phrase "pushed or otherwise moved up" and "pushed or otherwise moved down" are relative terms that depend on the orientation of the electronic device. For example, if electronic device 100a were rotated ninety-degrees (90°) from the orientation illustrated n FIG. 1B, then the phrase "pushed or otherwise moved up" may mean to be pushed or otherwise moved out and the phrase "pushed or otherwise moved down" may mean to be pushed or otherwise moved in.

In some examples, the distance between the individual slats of the inlet can be increased to reduce the top inlet resistance and facilitate higher inflow to the fan. More specifically, the inlet may be a two layered structure with a lower sliding layer of slats and a sliding inlet mechanism can be configured to increase the inlet OAR in the closed configuration as compared to the open configuration. When electronic device is in the open configuration, the layers are side-by-side to maintain the top inlet slat spacing at a distance to comply with UL inlet opening requirements. When the electronic device is in a closed configuration, one layer is over the other layer to increase the distance between each slat of the inlet. For example, the distance between each slat in the inlet may be about one (1) millimeter (mm) or less when the electronic device is in an open configuration (as illustrated in FIGS. 1A and 1B) to comply with UL standards. When the electronic device is in a close configuration (as illustrated in FIG. 1C), the distance between each slat in the inlet may be greater than about one (1) millimeter (mm).

More specifically, the movable layer of the slats can slide by about one (1) to about one and a half (1.5) mm such that the slats in the movable layer align with the slats in the other layer (e.g., a top static layer), increasing the gap between the slats of the inlet. This increase in OAR causes a reduction in top inlet flow resistance, enabling higher air flow to the fan. As the lid is closed and the electronic device is in a closed configuration, the UL inlet opening size requirements are not applicable to the electronic device while in the closed configuration.

In an example implementation, electronic device 100a is meant to encompass a computer, a personal digital assistant (PDA), a laptop or electronic notebook, a cellular telephone, an iPhone, an IP phone, or any other device, component, element, or object that includes an inlet that can be covered. Electronic device 100a may include any suitable hardware, software, components, modules, or objects that facilitate the operations thereof, as well as suitable interfaces for receiving, transmitting, and/or otherwise communicating data or information in a network environment. This may be inclusive of appropriate algorithms and communication protocols that allow for the effective exchange of data or information. Electronic device 100a may include virtual elements.

In regards to the internal structure associated with electronic device 100a, electronic device 100a can include memory elements for storing information to be used in operations or functions. Electronic device 100a may keep information in any suitable memory element (e.g., random access memory (RAM), read-only memory (ROM), erasable programmable ROM (EPROM), electrically erasable programmable ROM (EEPROM), application specific integrated circuit (ASIC), etc.), software, hardware, firmware, or in any other suitable component, device, element, or object where appropriate and based on particular needs. Any of the memory items discussed herein should be construed as being encompassed within the broad term 'memory element.' Moreover, the information being used, tracked, sent, or received in electronic device 100a could be provided in any database, register, queue, table, cache, control list, or other storage structure, all of which can be referenced at any suitable timeframe. Any such storage options may also be included within the broad term 'memory element' as used herein.

In certain example implementations, functions may be implemented by logic encoded in one or more tangible media (e.g., embedded logic provided in an ASIC, digital signal processor (DSP) instructions, software (potentially inclusive of object code and source code) to be executed by a processor, or other similar machine, etc.), which may be inclusive of non-transitory computer-readable media. In some of these instances, memory elements can store data used for the operations described herein. This includes the memory elements being able to store software, logic, code, or processor instructions that are executed to carry out the activities.

Additionally, electronic device 100a may include one or more processors that can execute software or an algorithm to perform activities. A processor can execute any type of instructions associated with the data to achieve one or more operations. In one example, the processors could transform an element or an article (e.g., data) from one state or thing to another state or thing. In another example, the activities outlined herein may be implemented with fixed logic or programmable logic (e.g., software/computer instructions executed by a processor) and electronic device 100a could include some type of a programmable processor, programmable digital logic (e.g., a field programmable gate array (FPGA), an erasable programmable read-only memory (EPROM), an electrically erasable programmable read-only memory (EEPROM)) or an ASIC that includes digital logic, software, code, electronic instructions, or any suitable combination thereof. Any of the potential processing elements and modules described herein should be construed as being encompassed within the broad term 'processor.'

Figure 2A:
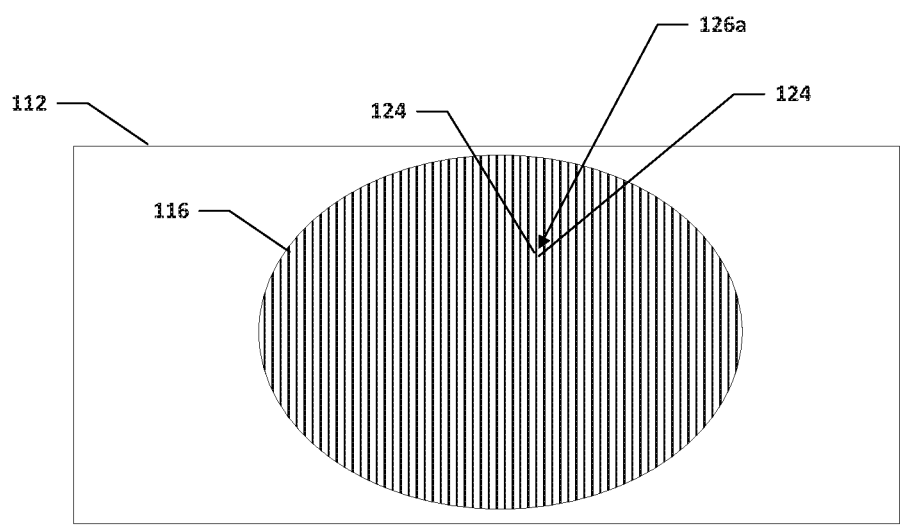
FIG. 2A is a simplified block diagram view of a portion of an electronic device to enable a movable inlet for a fan, in accordance with an embodiment of the present disclosure.

Turning to FIG. 2A, FIG. 2A is a simplified block diagram of a portion of inlet portion 112. In an example, inlet portion 112 can include inlet 116. Inlet 116 can include a plurality of slats 124. When electronic device 100a is in an open configuration (as illustrated in FIGS. 1A and 1B), a distance 126a between each slat 124 in inlet 116 may be about one (1) millimeter (mm) or less. In some examples, distance 126a is a UL compliant distance or some other distance that is based on some other regulation or guideline.

Figure 2B:
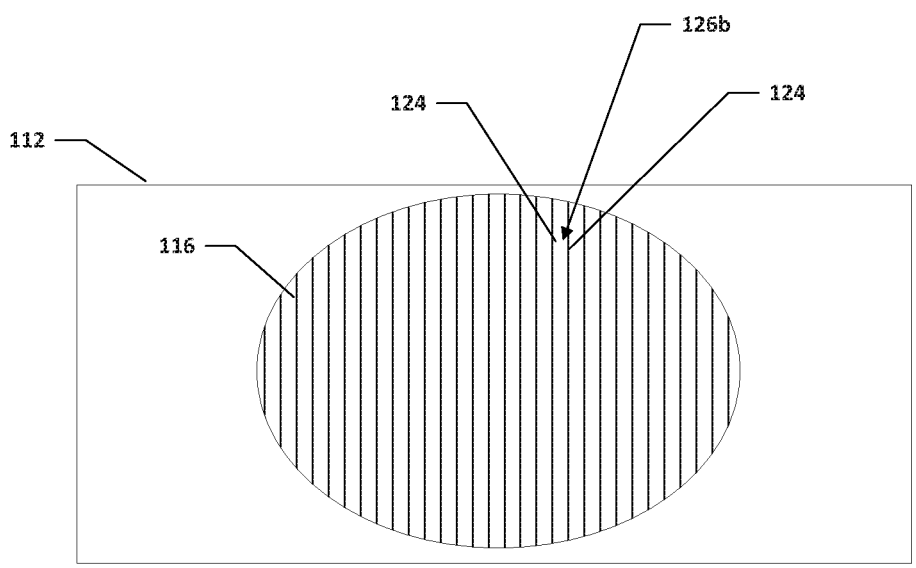
FIG. 2B is a simplified block diagram view of a portion of an electronic device to enable a movable inlet for a fan, in accordance with an embodiment of the present disclosure.

Turning to FIG. 2B, FIG. 2B is a simplified block diagram of a portion of inlet portion 112. In an example, inlet portion 112 can include inlet 116. Inlet 116 can include a plurality of slats 124. When electronic device 100a is in a close configuration (as illustrated in FIG. 1C), a distance 126b between each slat 124 in inlet 116 may be greater than about one (1) millimeter (mm). By increasing the OAR of inlet 116, more air can be collected by fan 114 and used to cool electronic device 100a. This allows for increased performance, even when electronic device 100a is in a close configuration. In some examples, because electronic device 100a is in a closed configuration, distance 126b is greater than a UL compliant distance for open configuration devices or some other distance that is based on some other regulation or guideline for open configuration devices.

Figure 3A:
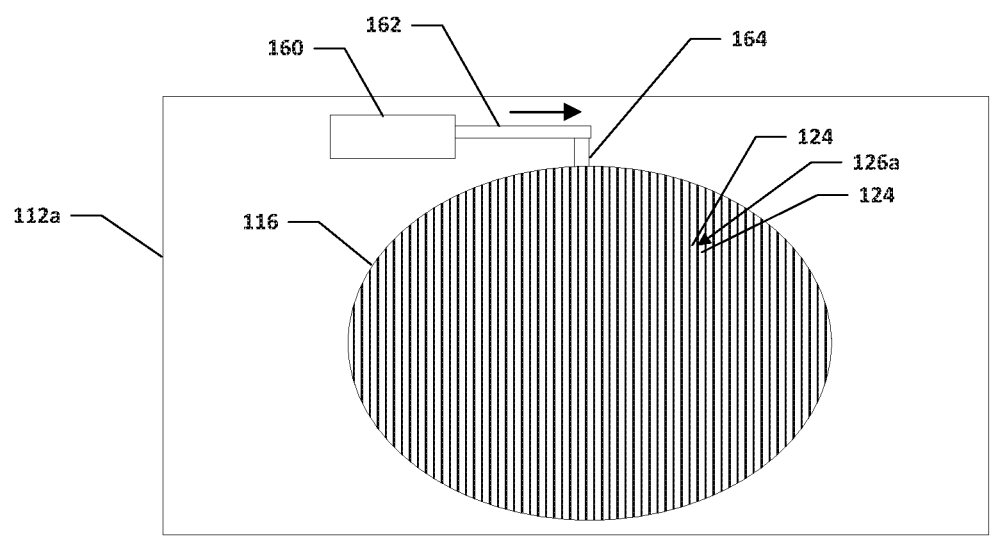
FIG. 3A is a simplified block diagram view of a portion of an electronic device to enable a movable inlet for a fan, in accordance with an embodiment of the present disclosure.

Turning to FIG. 3A, FIG. 3A is a simplified block diagram of a portion of inlet portion 112a. In an example, inlet portion 112a can include inlet 116, an inlet engine 160, an inlet engine arm 162, and a slat moving arm 164. Inlet 116 can include plurality of slats 124. When electronic device 100a is in an open configuration (as illustrated in FIGS. 1A and 1B), to comply with UL standards, inlet engine 160 can cause distance 126a between each slat 124 in inlet 116 to be about one (1) millimeter (mm) or less. More specifically, when electronic device 110a is converted to an open configuration, inlet engine 160 can be configured to move inlet engine arm 162. The movement of inlet engine arm 162 can be transferred to slat moving arm 164 to cause distance 126a between each slat 124 in inlet 116 to be about one (1) millimeter (mm) or less. In a specific illustrative example, slat moving arm 164 is coupled to sliding slats and the sliding slats that can be moved to a position between static slats in inlet 116.

Figure 3B:
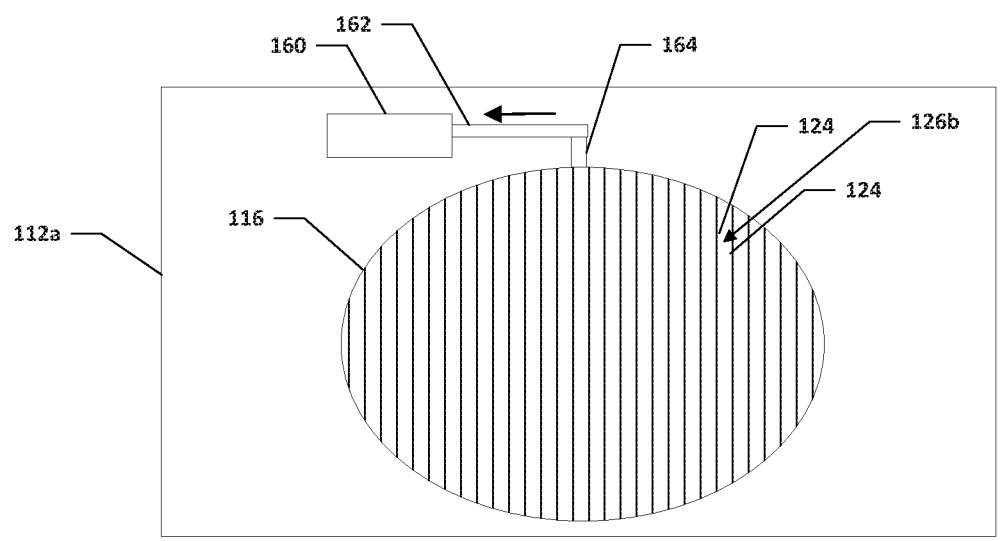
FIG. 3B is a simplified block diagram view of a portion of an electronic device to enable a movable inlet for a fan, in accordance with an embodiment of the present disclosure.

Turning to FIG. 3B, FIG. 3B is a simplified block diagram of a portion of inlet portion 112a. In an example, inlet portion 112a can include inlet 116, inlet engine 160, inlet engine arm 162, and slat moving arm 164. Inlet 116 can include plurality of slats 124. When electronic device 100a is in a close configuration (as illustrated in FIG. 1C), distance 126b between each slat 124 in inlet 116 may be greater than about one (1) millimeter (mm). More specifically, when electronic device 100a is in a close configuration (as illustrated in FIG. 1C), inlet engine 160 can be configured to move inlet engine arm 162. The movement of inlet engine arm 162 can be transferred to slat moving arm 164 to cause distance 126b between each slat 124 in inlet 116 to be greater than about one (1) millimeter (mm). In a specific illustrative example, slat moving arm 164 is coupled to sliding slats and the sliding slats that can be moved to a position over static slats in inlet 116. By increasing the OAR of inlet 116, more air can be collected by fan 114 and used to cool electronic device 100a. This allows for increased performance, even when electronic device 100a is in a close configuration. In an example, inlet control engine 130 (not shown) can cause the distance between each slat 124 of inlet 116 to increase. In another example, inlet control engine 130 (not shown) can cause inlet engine 160 to increase in the distance between each slat 124 of inlet 116 and allow more air to enter inlet 116 and reach fan 114.

Figure 4:
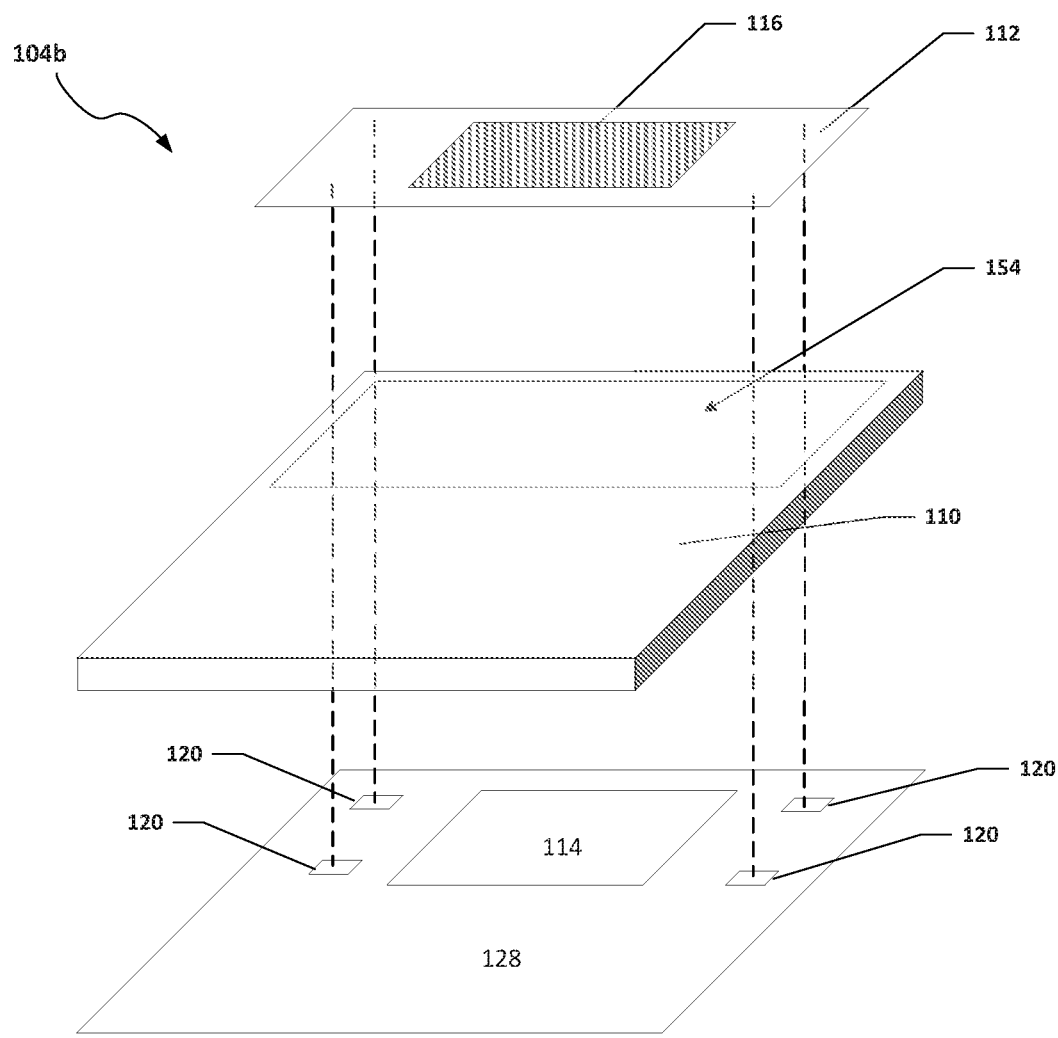
FIG. 4 is a simplified block diagram exploded view of a portion of an electronic device to enable a movable inlet for a fan, in accordance with an embodiment of the present disclosure.

Turning to FIG. 4, FIG. 4 is a simplified block diagram of an exploded view of a second housing 104b. In an example, second housing 104b can include a bottom surface 128. Fan 114 and actuators 120 can be on or over bottom surface 128. Keyboard portion 110 can be over bottom surface 128. Keyboard portion 110 can include an inlet cavity 154. Inlet portion 112 can be positioned in inlet cavity 154 and on or over actuators 120 such that inlet portion 112 can move up and down relative to keyboard portion 110. Inlet portion 112 can include inlet 116.

Figure 5A:
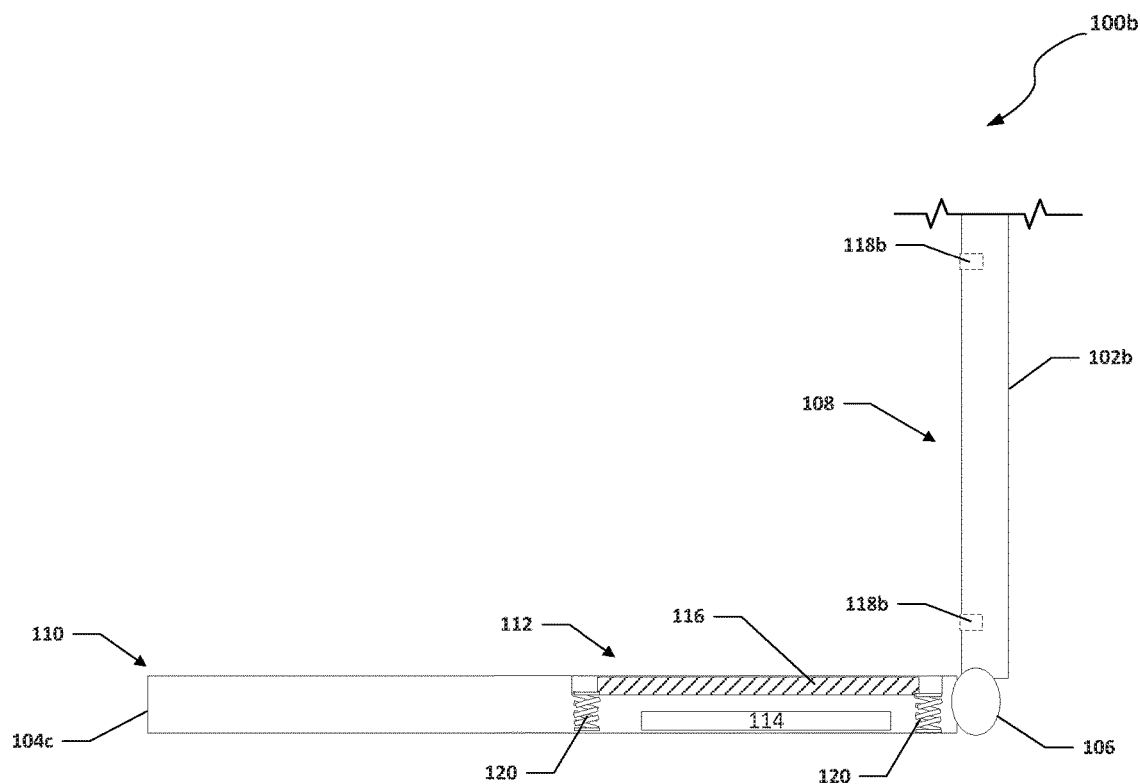
FIG. 5A is a simplified block diagram of an electronic device to enable a movable inlet for a fan, in accordance with an embodiment of the present disclosure.

Turning to FIG. 5A, FIG. 5A is a simplified block diagram side view of electronic device 100b configured with a movable inlet for a fan, in accordance with an embodiment of the present disclosure. Electronic device 100b can include a first housing 102b and second housing 104c. First housing 102b can be rotatably coupled to second housing 104c using hinge 106. First housing 102b can include display 108 and tabs 118b. Second housing 104c can include keyboard portion 110, inlet portion 112, fan 114, and actuators 120. Inlet portion 112 can include inlet 116.

As illustrated in FIG. 5A, electronic device 100b is in an open configuration. In the open configuration, first housing 102b has been rotated away from second housing 104c and airflow into inlet 116 is unobstructed. Fan 114 can use the air collected through inlet 116 (and any other inlets to fan 114) to help cool electronics, components, elements, etc. of electronic device 100b. Actuators 120 may be springs or some other mechanism that can push inlet portion 112 away from fan 114 such that inlet portion 112 is in relatively the same plane as keyboard portion 110. In an example, actuators 120 push or otherwise cause inlet portion 112 to be relatively even with keyboard portions 110 such that second housing 104c has a relatively flat profile. In the open configuration, tabs 118b are recessed in first housing 102b so that first housing 102b has a relatively smooth profile.

Figure 5B:
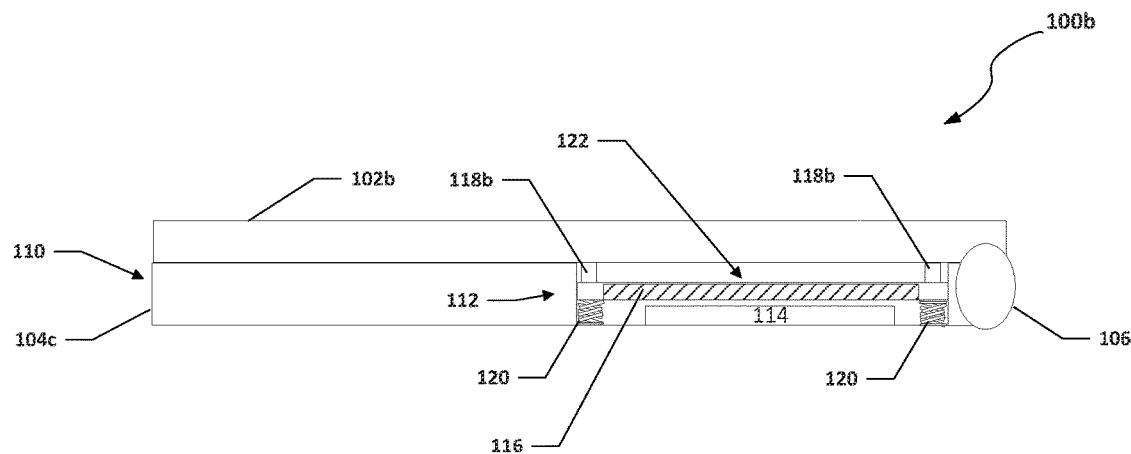
FIG. 5B is a simplified block diagram of an electronic device to enable a movable inlet for a fan, in accordance with an embodiment of the present disclosure.

Turning to FIG. 5B, FIG. 5B is a simplified block diagram of electronic device 100b configured with a movable inlet for a fan, in accordance with an embodiment of the present disclosure. Electronic device 100b can include first housing 102b and second housing 104c. First housing 102b can be rotatably coupled to second housing 104c using hinge 106. First housing 102b can include display 108 and tabs 118b. Second housing 104c can include keyboard portion 110, inlet portion 112, fan 114, and actuators 120. Inlet portion 112 can include inlet 116.

As illustrated in FIG. 5B, electronic device 100b is in a closed configuration. In the closed configuration, first housing 102b has been rotated towards second housing 104c. As first housing 102b is rotated towards second housing 104c, tabs 118b extend from first housing 102b and come into contact with inlet portion 112 and create a downward force on inlet portion 112. The downward force on inlet portion 112 causes actuators 120 to compress and allow inlet portion 112 to move out of the plane of keyboard portion 110 and create gap 122 between inlet portion 112 and first housing 102b. Gap 122 allows air to flow into inlet 116 and to fan 114. If inlet portion 112 did not move out of the plane of keyboard portion 110 and create gap 122 between inlet portion 112 and first housing 102b, then first housing 102b would be over inlet 116 and would restrict the airflow into inlet 116 and cause a performance reduction by fan 114.

Gap 122 can provide a channel to allow air to flow through inlet 116 and to fan 114. In some examples, the top inlet OAR is also increased to improve the air intake. For example, the distance between each slat in inlet 116 may be about one (1) millimeter (mm) or less when electronic device 100b is in an open configuration (as illustrated in FIG. 4A) to comply with UL standards. When electronic device 100b is in a close configuration (as illustrated in FIG. 4B), the distance between each slat in inlet 116 may be greater than about one (1) millimeter (mm). By creating gap 122 when electronic device 100b is in a close configuration (as illustrated in FIG. 4B) and/or increasing the OAR of inlet 116, more air can be collected by fan 114 and used to cool electronic device 100b. This allows for increased performance, even when electronic device 100b is in a close configuration.

Figure 6A:
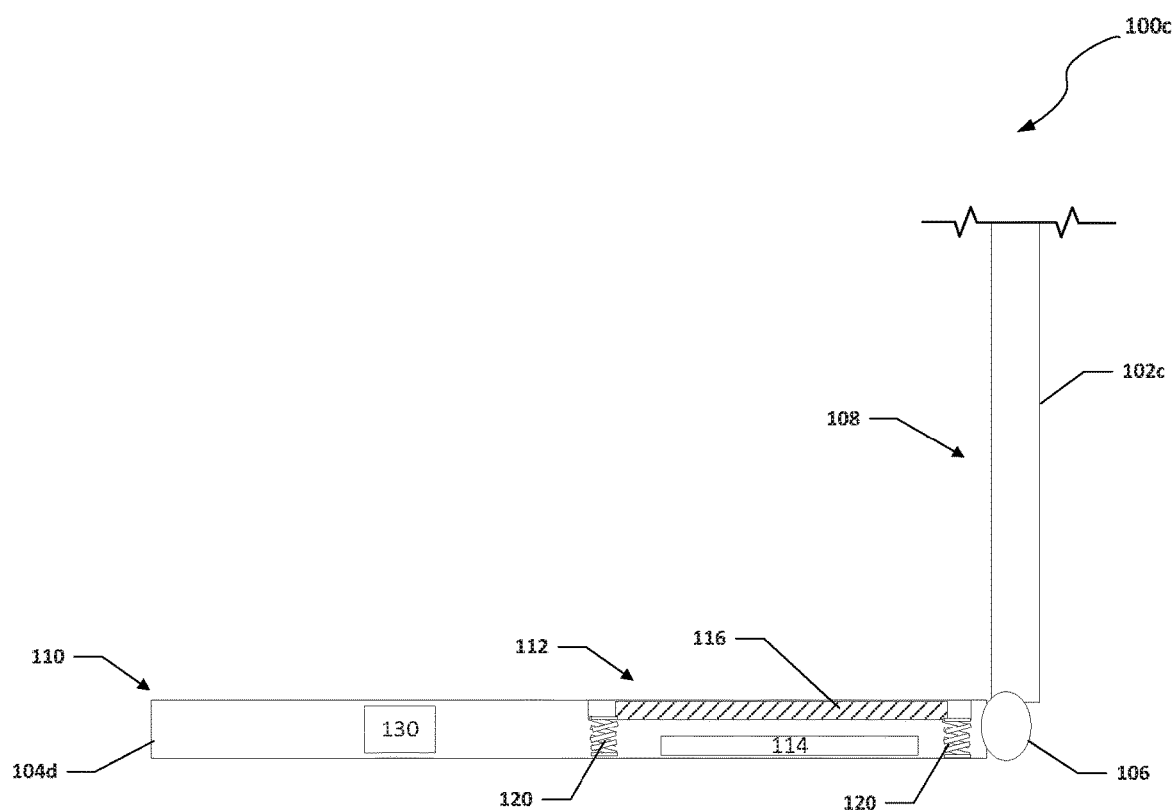
FIG. 6A is a simplified block diagram of an electronic device to enable a movable inlet for a fan, in accordance with an embodiment of the present disclosure.

Turning to FIG. 6A, FIG. 6A is a simplified block diagram side view of electronic device 100c configured with a movable inlet for a fan, in accordance with an embodiment of the present disclosure. Electronic device 100c can include a first housing 102c and a second housing 104d. First housing 102c can be rotatably coupled to second housing 104d using hinge 106. First housing 102c can include display 108. Second housing 104d can include keyboard portion 110, inlet portion 112, fan 114, actuators 120, and an inlet control engine 130. Inlet portion 112 can include inlet 116. Inlet control engine 130 can control actuators 120 to raise or lower inlet portion 112 relative to keyboard portion 110 and can control the increase or decrease of the distance between slats (e.g., slats 124 illustrated in FIGS. 2A and 2B) in inlet 116.

As illustrated in FIG. 6A, electronic device 100c is in an open configuration. In the open configuration, first housing 102c has been rotated away from second housing 104d and airflow into inlet 116 is unobstructed. Fan 114 can use the air collected through inlet 116 (and any other inlets to fan 114) to help cool electronics, components, elements, etc. of electronic device 100c. Actuators 120 may be springs or some other mechanism that can push inlet portion 112 away from fan 114 such that inlet portion 112 is in relatively the same plane as keyboard portion 110. In an example, actuators 120 push or otherwise cause inlet portion 112 to be relatively even with keyboard portion 110 such that second housing 104d has a relatively flat profile.

Figure 6B:
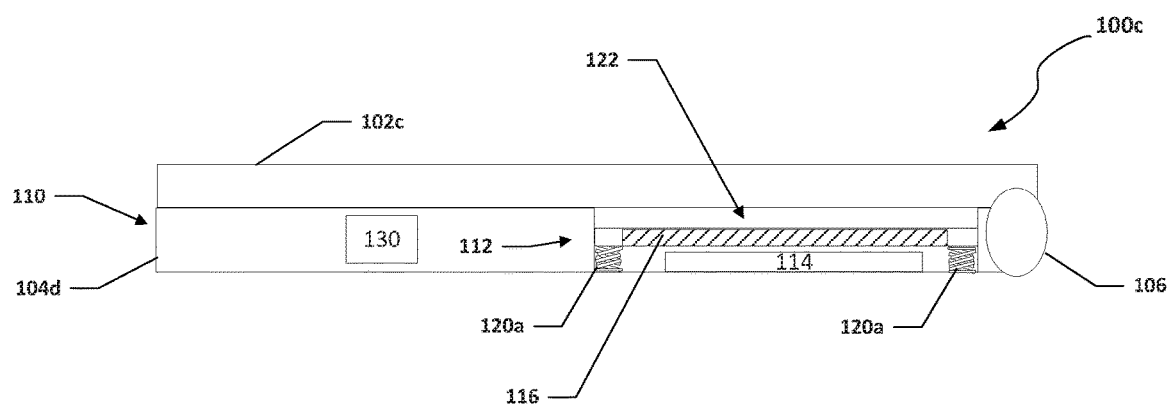
FIG. 6B is a simplified block diagram of an electronic device to enable a movable inlet for a fan, in accordance with an embodiment of the present disclosure.

Turning to FIG. 6B, FIG. 6B is a simplified block diagram of electronic device 100c configured with a movable inlet for a fan, in accordance with an embodiment of the present disclosure. Electronic device 100c can include first housing 102c and second housing 104d. First housing 102c can be rotatably coupled to second housing 104d using hinge 106. First housing 102c can include display 108. Second housing 104d can include keyboard portion 110, inlet portion 112, fan 114, actuators 120, and inlet control engine 130. Inlet portion 112 can include inlet 116.

As illustrated in FIG. 6B, electronic device 100c is in a closed configuration. In the closed configuration, first housing 102c has been rotated towards second housing 104d. As first housing 102c is rotated towards second housing 104d, inlet control engine 130 causes actuators 120 to compress and allow inlet portion 112 to move out of the plane of keyboard portion 110 and create gap 122 between inlet portion 112 and first housing 102c. Gap 122 allows air to flow into inlet 116 and to fan 114. If inlet portion 112 did not move out of the plane of keyboard portion 110 and create gap 122 between inlet portion 112 and first housing 102c, then first housing 102c would be over inlet 116 and would restrict the airflow into inlet 116 and cause a performance reduction by fan 114.

Gap 122 can provide a channel to allow air to flow through inlet 116 and to fan 114. In some examples, inlet control engine 130 causes the top inlet OAR to increase to improve the air intake. For example, the distance between each slat in inlet 116 may be about one (1) millimeter (mm) or less when electronic device 100c is in an open configuration (as illustrated in FIG. 6A) to comply with UL standards. When electronic device 100c is in a close configuration (as illustrated in FIG. 6B), the distance between each slat in inlet 116 may be greater than about one (1) millimeter (mm). By creating gap 122 when electronic device 100c is in a close configuration (as illustrated in FIG. 5B) and/or increasing the OAR of inlet 116, more air can be collected by fan 114 and used to cool electronic device 100c. This allows for increased performance, even when electronic device 100c is in a close configuration.

Figure 7A:
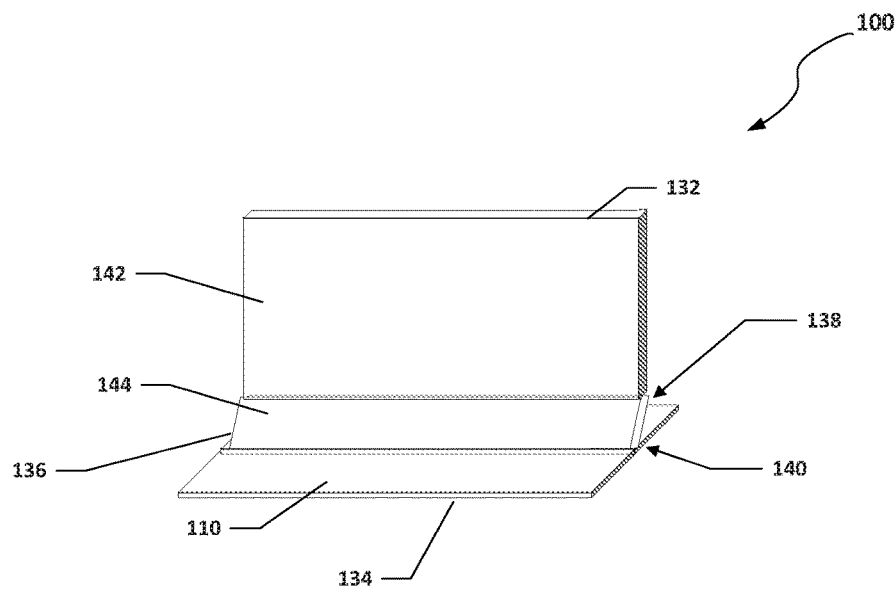
FIG. 7A is a simplified block diagram of an electronic device to enable a movable inlet for a fan, in accordance with an embodiment of the present disclosure.

Turning to FIG. 7A, FIG. 7A is a simplified block diagram of an electronic device 100d configured with a movable inlet for a fan, in accordance with an embodiment of the present disclosure. In an example, electronic device 100d can include a first housing 132, a second housing 134, and a third housing 136. First housing 132 can be rotatably coupled to third housing 136 using a hinge 138. Second housing 134 can be rotatably coupled to third housing 136 using a hinge 140. First housing 132 can include a primary display 142. Second housing 134 can include keyboard portion 110, inlet portion 112 (not shown), and fan 114 (not shown). Third housing 136 can include secondary display 144.

Figure 7B:
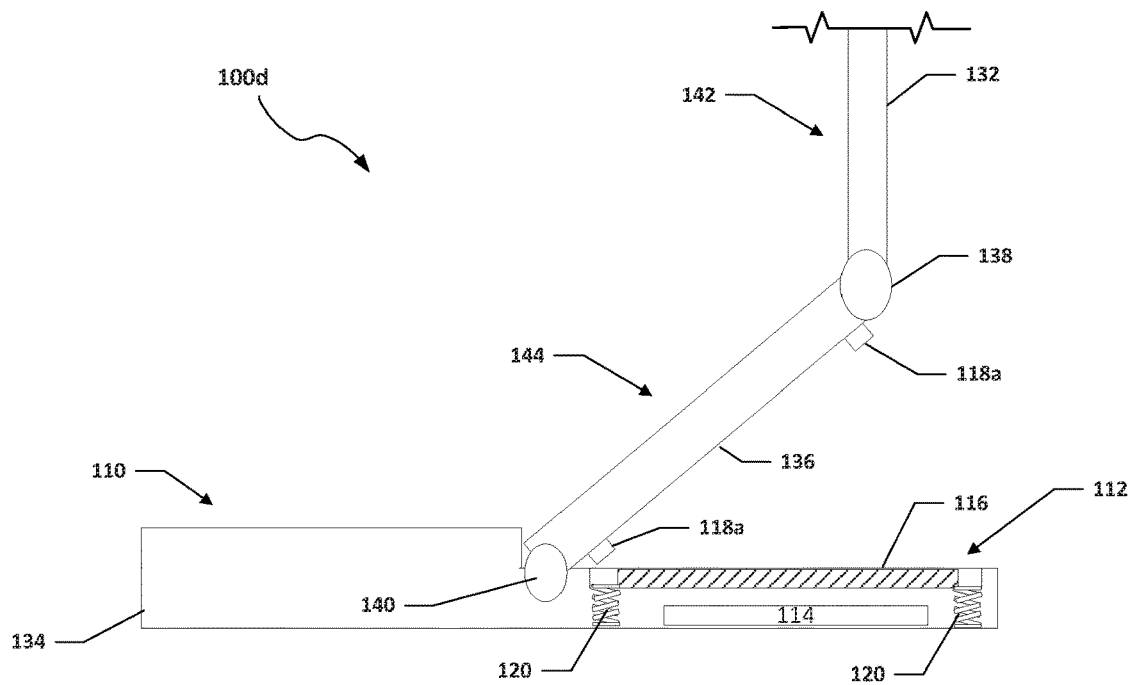
FIG. 7B is a simplified block diagram of an electronic device to enable a movable inlet for a fan, in accordance with an embodiment of the present disclosure.

Turning to FIG. 7B, FIG. 7B is a simplified block diagram side view of electronic device 100*d* configured with a movable inlet for a fan, in accordance with an embodiment of the present disclosure. Electronic device 100*d* can include first housing 132, second housing 134, and third housing 136. First housing 132 can be rotatably coupled to third housing 136 using hinge 138. Second housing 134 can be rotatably coupled to third housing 136 using hinge 140. First housing 132 can include primary display 142. Second housing 134 can include keyboard portion 110, inlet portion 112, fan 114, and actuators 120. Inlet portion 112 can include inlet 116. Third housing 136 can include secondary display 144 and tabs 118*a*.

As illustrated in FIGS. 7A and 7B, electronic device 100*d* is in an open configuration. In the open configuration, third housing 136 has been rotated away from second housing 134 and airflow into inlet 116 is unobstructed. Fan 114 can use the air collected through inlet 116 (and any other inlets to fan 114) to help cool electronics, components, elements, etc. of electronic device 100*d*. Actuators 120 may be springs or some other mechanism that can push inlet portion 112 away from fan 114. In an example, actuators 120 push or otherwise cause inlet portion 112 to be relatively even with keyboard portion 110 such that second housing 134 has a relatively flat profile.

Figure 7C:
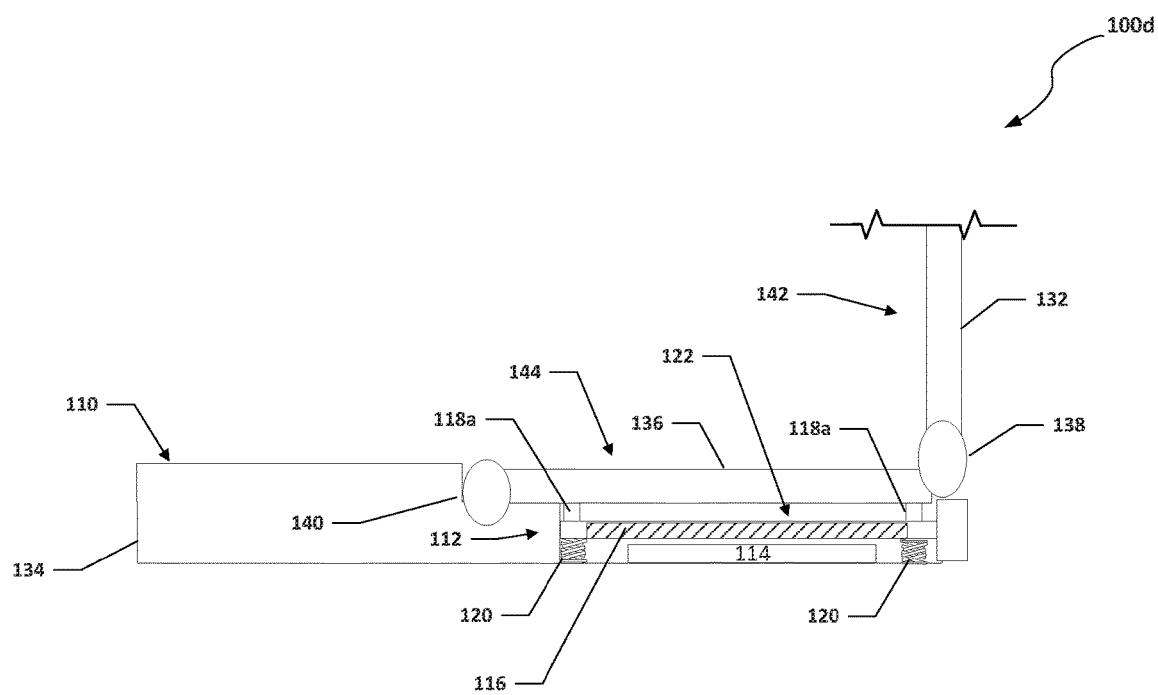
FIG. 7C is a simplified block diagram of an electronic device to enable a movable inlet for a fan, in accordance with an embodiment of the present disclosure.

Turning to FIG. 7C, FIG. 7C is a simplified block diagram of electronic device 100*d* configured with a movable inlet for a fan, in accordance with an embodiment of the present disclosure. Electronic device 100*d* can include first housing 132, second housing 134, and third housing 136. First housing 132 can be rotatably coupled to third housing 136 using hinge 138. Second housing 134 can be rotatably coupled to third housing 136 using hinge 140. First housing 132 can include primary display 142. Second housing 134 can include keyboard portion 110, inlet portion 112, fan 114, and actuators 120. Inlet portion 112 can include inlet 116. Third housing 136 can include secondary display 144 and tabs 118*a*.

Figure 7D:
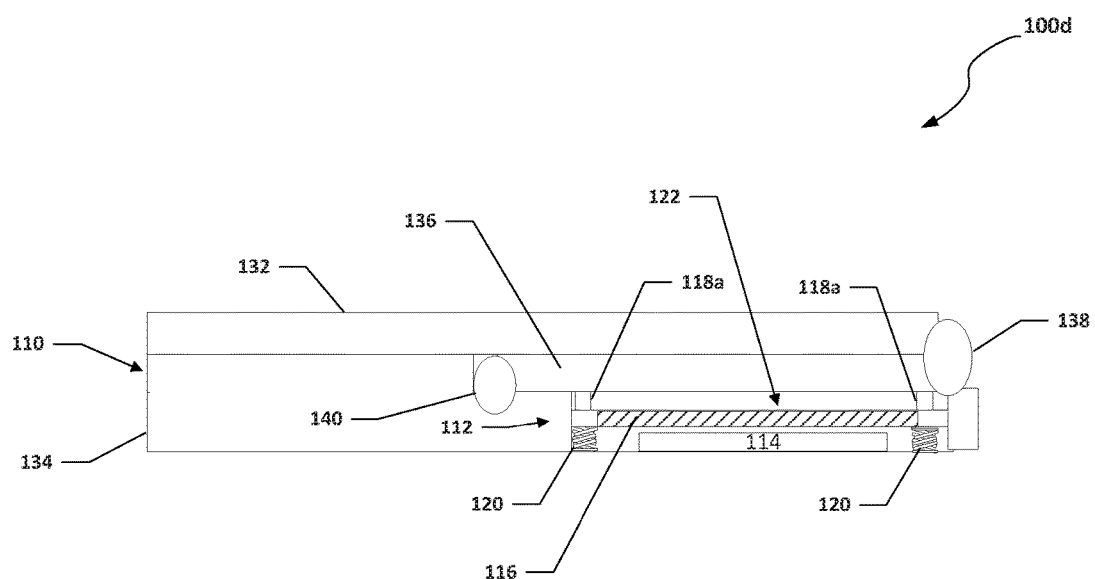
FIG. 7D is a simplified block diagram of an electronic device to enable a movable inlet for a fan, in accordance with an embodiment of the present disclosure.

As illustrated in FIG. 7C, electronic device 100*d* is in a semi-closed configuration. In the semi-closed configuration, third housing 136 has been rotated on hinge 140 towards second housing 134. As third housing 136 is rotated towards second housing 134, tabs 118*a* come into contact with inlet portion 112 and create a downward force on inlet portion 112. The downward force on inlet portion 112 causes actuators 120 to compress and allow inlet portion 112 to move towards fan 114 and create gap 122 between inlet portion 112 and third housing 136. Gap 122 allows air to flow into inlet 116 and to fan 114. If inlet portion 112 did not move and create gap 122 between inlet portion 112 and third housing 136, then third housing 136 would be over inlet 116 and would restrict the airflow into inlet 116 and cause a performance reduction by fan 114. As illustrated in FIG. 7D, electronic device 100*d* is in a closed configuration. In the closed configuration, first housing 132 has been rotated on hinge 138 towards second housing 134 and third housing 136. Gap 122 remains between inlet portion 112 and third housing 136 to allow air to flow into inlet 116 and to fan 114.

Gap 122 can provide a channel to allow air to flow through inlet 116 and to fan 114. In some examples, the OAR is also increased to improve the air intake. For example, the distance between each slat in inlet 116 may be about one (1) millimeter (mm) or less when electronic device 100*d* is in an open configuration (as illustrated in FIGS. 7A and 7B) to comply with UL standards. When electronic device 100*d* is in a semi-closed configuration (as illustrated in FIG. 7C) or a closed configuration (as illustrated in 7D), the distance between each slat in inlet 116 may be greater than about one (1) millimeter (mm). By creating gap 122 when electronic device 100*d* is in a semi-closed configuration (as illustrated in FIG. 7C) or a closed configuration (as illustrated in 7D) and/or increasing the OAR of inlet 116, more air can be collected by fan 114 and used to cool electronic device 100*d*. This allows for increased performance, even when electronic device 100*d* is in a semi-closed or closed configuration.

Figure 8A:
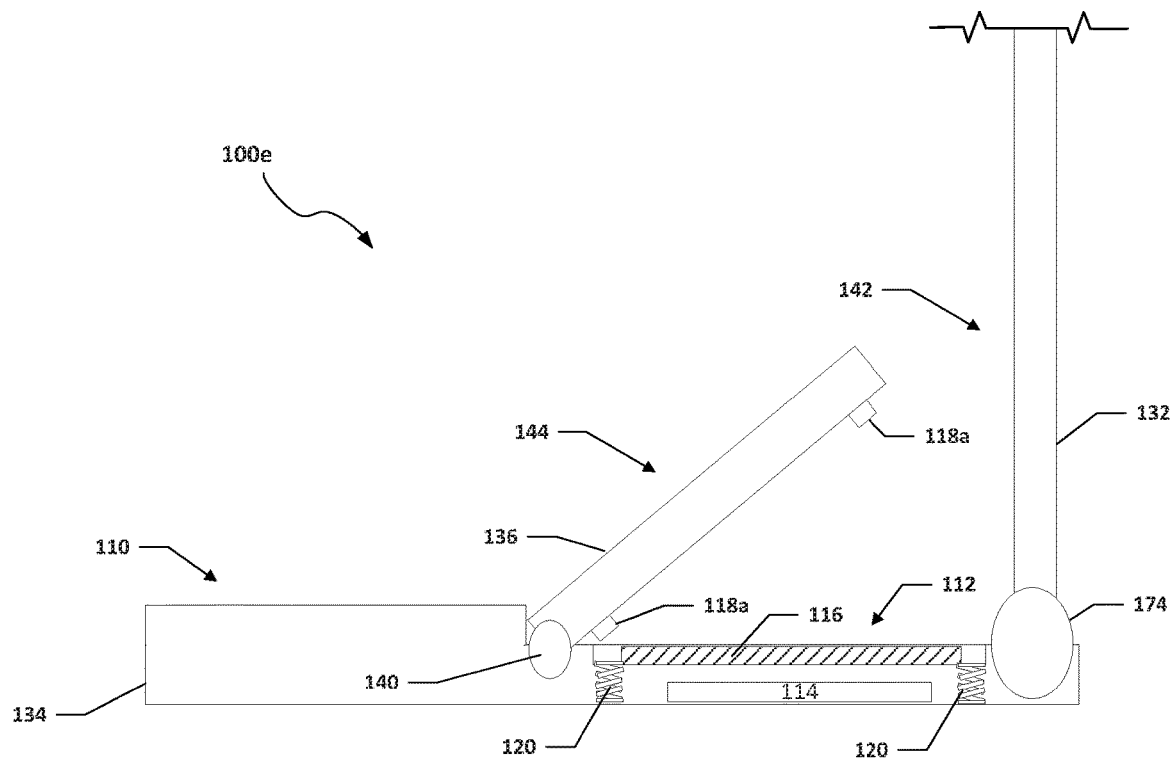
FIG. 8A is a simplified block diagram of an electronic device to enable a movable inlet for a fan, in accordance with an embodiment of the present disclosure.

Turning to FIG. 8A, FIG. 8A is a simplified block diagram side view of electronic device 100*e* configured with a movable inlet for a fan, in accordance with an embodiment of the present disclosure. Electronic device 100*e* can include first housing 132, second housing 134, and third housing 136. First housing 132 can be rotatably coupled to second housing 134 using hinge 174. Second housing 134 can be rotatably coupled to third housing 136 using hinge 140. First housing 132 can include primary display 142. Second housing 134 can include keyboard portion 110, inlet portion 112, fan 114, and actuators 120. Inlet portion 112 can include inlet 116. Third housing 136 can include secondary display 144 and tabs 118*a*.

As illustrated in FIG. 8A, electronic device 100*e* is in an open configuration. In the open configuration, third housing 136 has been rotated away from second housing 134 and airflow into inlet 116 is unobstructed. Fan 114 can use the air collected through inlet 116 (and any other inlets to fan 114) to help cool electronics, components, elements, etc. of electronic device 100*e*. Actuators 120 may be springs or some other mechanism that can push inlet portion 112 away from fan 114. In an example, actuators 120 push or otherwise cause inlet portion 112 to be relatively even with keyboard portion 110 such that second housing 134 has a relatively flat profile.

Figure 8B:
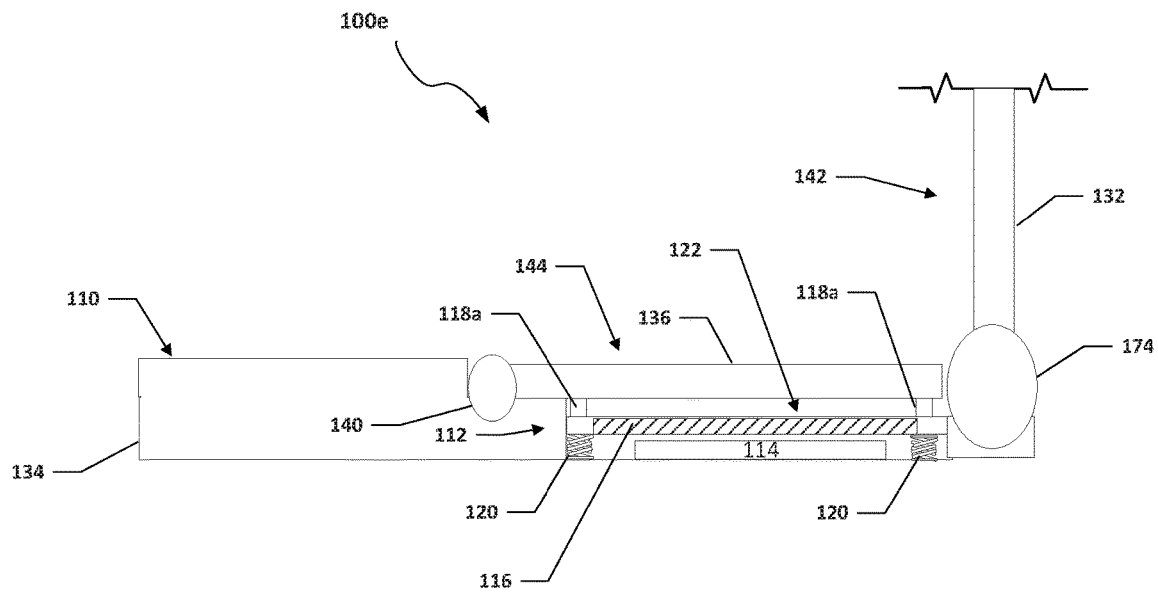
FIG. 8B is a simplified block diagram of an electronic device to enable a movable inlet for a fan, in accordance with an embodiment of the present disclosure.

Turning to FIG. 8B, FIG. 8B is a simplified block diagram of electronic device 100*e* configured with a movable inlet for a fan, in accordance with an embodiment of the present disclosure. Electronic device 100*e* can include first housing 132, second housing 134, and third housing 136. First housing 132 can be rotatably coupled to second housing 134 using hinge 174. Second housing 134 can be rotatably coupled to third housing 136 using hinge 140. First housing 132 can include primary display 142. Second housing 134 can include keyboard portion 110, inlet portion 112, fan 114, and actuators 120. Inlet portion 112 can include inlet 116. Third housing 136 can include secondary display 144 and tabs 118*a*.

Figure 8C:
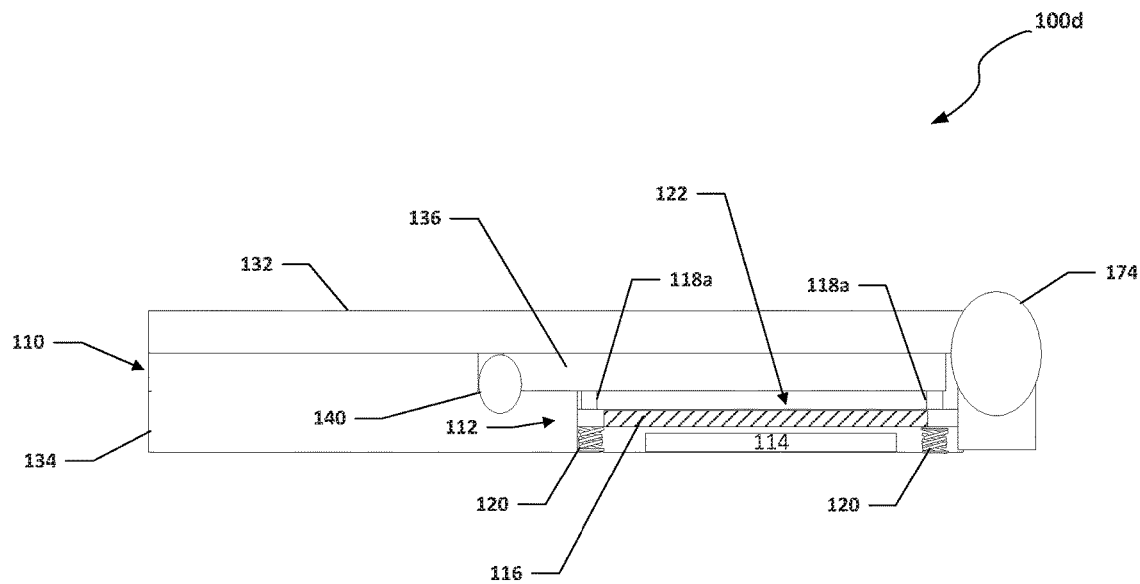
FIG. 8C is a simplified block diagram of an electronic device to enable a movable inlet for a fan, in accordance with an embodiment of the present disclosure.

As illustrated in FIG. 8B, electronic device 100*e* is in a semi-closed configuration. In the semi-closed configuration, third housing 136 has been rotated on hinge 140 towards second housing 134. As third housing 136 is rotated towards second housing 134, tabs 118*a* come into contact with inlet portion 112 and create a downward force on inlet portion 112. The downward force on inlet portion 112 causes actuators 120 to compress and allow inlet portion 112 to move towards fan 114 and create gap 122 between inlet portion 112 and third housing 136. Gap 122 allows air to flow into inlet 116 and to fan 114. If inlet portion 112 did not move and create gap 122 between inlet portion 112 and third housing 136, then third housing 136 would be over inlet 116 and would restrict the airflow into inlet 116 and cause a performance reduction by fan 114. As illustrated in FIG. 8C, electronic device 100e is in a closed configuration. In the closed configuration, first housing 132 has been rotated on hinge 174 towards second housing 134 and third housing 136. Gap 122 remains between inlet portion 112 and third housing 136 to allow air to flow into inlet 116 and to fan 114.

Gap 122 can provide a channel to allow air to flow through inlet 116 and to fan 114. In some examples, the OAR is also increased to improve the air intake. For example, the distance between each slat in inlet 116 may be about one (1) millimeter (mm) or less when electronic device 100e is in an open configuration (as illustrated in FIG. 8A) to comply with UL standards. When electronic device 100e is in a semi-closed configuration (as illustrated in FIG. 8B) or a closed configuration (as illustrated in 8C), the distance between each slat in inlet 116 may be greater than about one (1) millimeter (mm). By creating gap 122 when electronic device 100e is in a semi-closed configuration (as illustrated in FIG. 8B) or a closed configuration (as illustrated in 8C) and/or increasing the OAR of inlet 116, more air can be collected by fan 114 and used to cool electronic device 100e. This allows for increased performance, even when electronic device 100e is in a semi-closed or closed configuration.

Figure 9A:
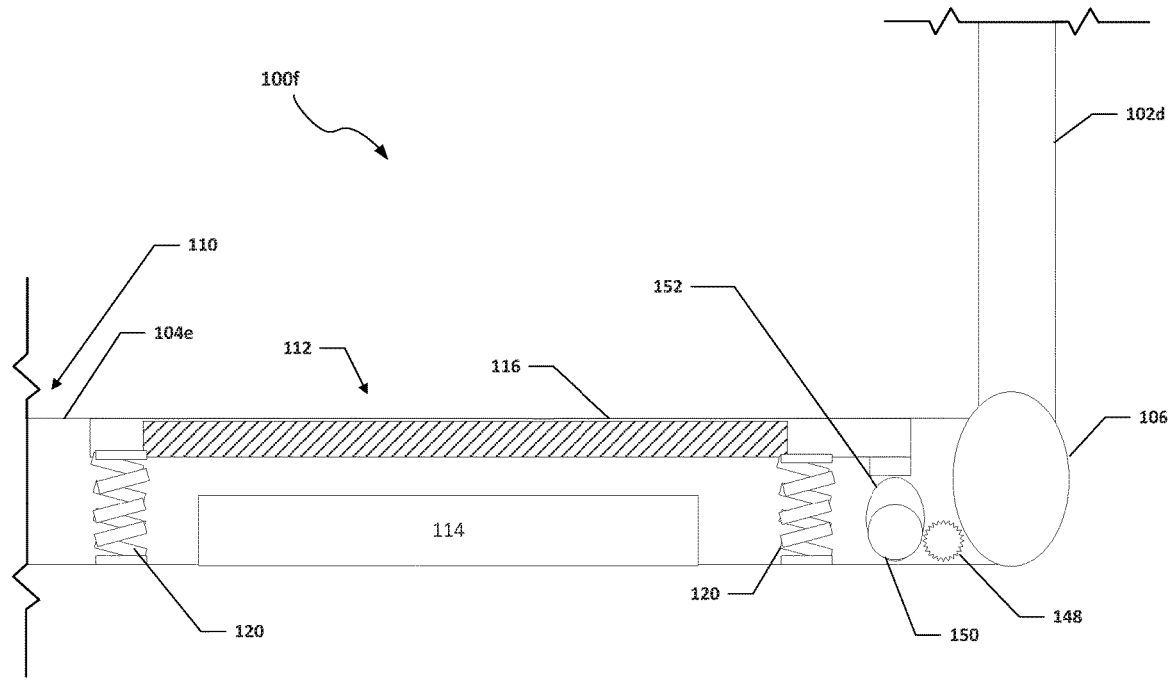
FIG. 9A is a simplified block diagram of an electronic device to enable a movable inlet for a fan, in accordance with an embodiment of the present disclosure.

Turning to FIG. 9A, FIG. 9A is a simplified block diagram side view of electronic device 100f configured with a movable inlet for a fan, in accordance with an embodiment of the present disclosure. Electronic device 100f can include first housing 102d and a second housing 104e. First housing 102d can be rotatably coupled to second housing 104e using hinge 106. First housing 102d can include display 108. In some example, first housing 102d can include tabs 118a or 118b. Second housing 104e can include keyboard portion 110, inlet portion 112, fan 114, actuators 120, an idler gear 148, and a cam 150. In some examples, second housing 104e can include inlet control engine 130. Cam 150 can include a locking extension 152. Inlet portion 112 can include inlet 116. Idler gear 148 can be configured to transfer rotation from hinge 106 to cam 150. Cam 150 can be configured to convert the rotation from idler gear 148 to linear motion that can be used to raise or lower inlet portion 112 and/or can be used as a stop or block to help prevent inlet portion 112 from being lowered.

As illustrated in FIG. 9A, electronic device 100f is in an open configuration. In the open configuration, first housing 102d has been rotated away from second housing 104e and airflow into inlet 116 is unobstructed. Fan 114 can use the air collected through inlet 116 (and any other inlets to fan 114) to help cool electronics, components, elements, etc. of electronic device 100f. Actuators 120 may be springs or some other mechanism that can push inlet portion 112 away from fan 114 such that inlet portion 112 is in relatively the same plane as keyboard portion 110. In an example, rotation from hinge 106 is transferred to cam 150. Cam 150 can convert the rotation from idler gear 148 to linear motion that can be used to help raise inlet portion 112. In another example, locking extension 152 can be rotated under inlet portion and can be used as a stop or block to help prevent inlet portion 112 from being lowered while electronic device 100f is in the open configuration.

Figure 9B:
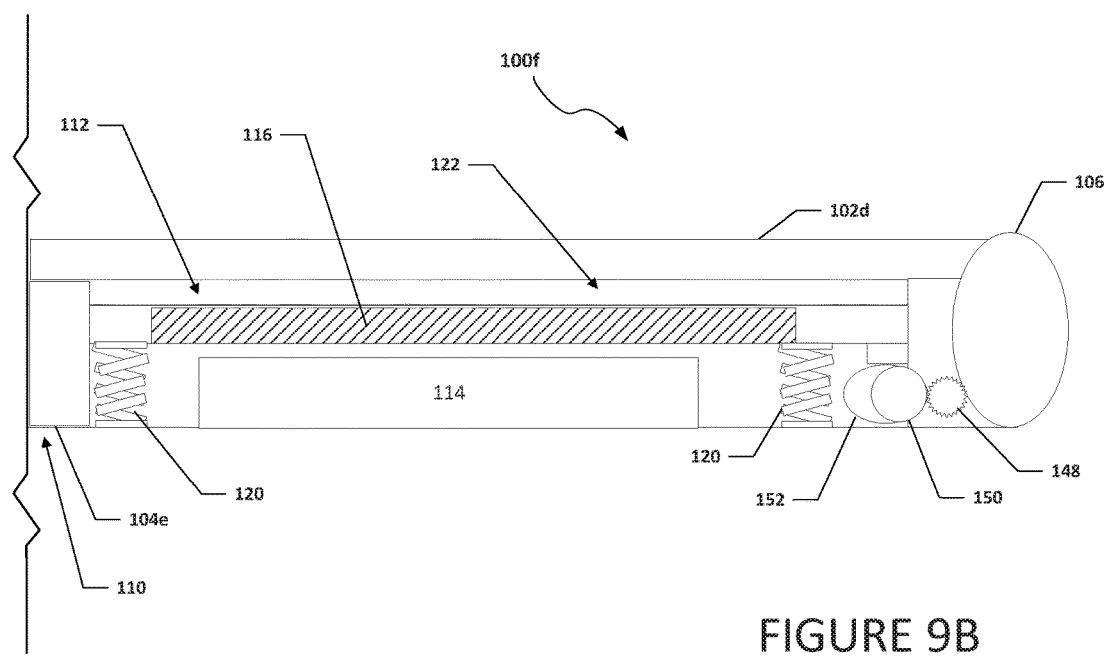
FIG. 9B is a simplified block diagram of an electronic device to enable a movable inlet for a fan, in accordance with an embodiment of the present disclosure.

Turning to FIG. 9B, FIG. 9B is a simplified block diagram of electronic device 100f configured with a movable inlet for a fan, in accordance with an embodiment of the present disclosure. Electronic device 100f can include first housing 102d and second housing 104e. First housing 102d can be rotatably coupled to second housing 104e using hinge 106. First housing 102d can include display 108. Second housing 104e can include keyboard portion 110, inlet portion 112, fan 114, actuators 120, idler gear 148, and cam 150. Cam 150 can include locking extension 152. Inlet portion 112 can include inlet 116.

As illustrated in FIG. 9B, electronic device 100f is in a closed configuration. In the closed configuration, first housing 102d has been rotated towards second housing 104e. As first housing 102d is rotated towards second housing 104e, rotation from hinge 106 is transferred to cam 150. Cam 150 can convert the rotation from idler gear 148 to linear motion that can be used to help lower inlet portion 112. In another example, locking extension 152 can be rotated away from inlet portion and can be used as a release or un-block to help allow inlet portion 112 to move out of the plane of keyboard portion 110 and create gap 122 between inlet portion 112 and first housing 102d. Gap 122 can provide a channel to allow air to flow through inlet 116 and to fan 114.

Figure 10:
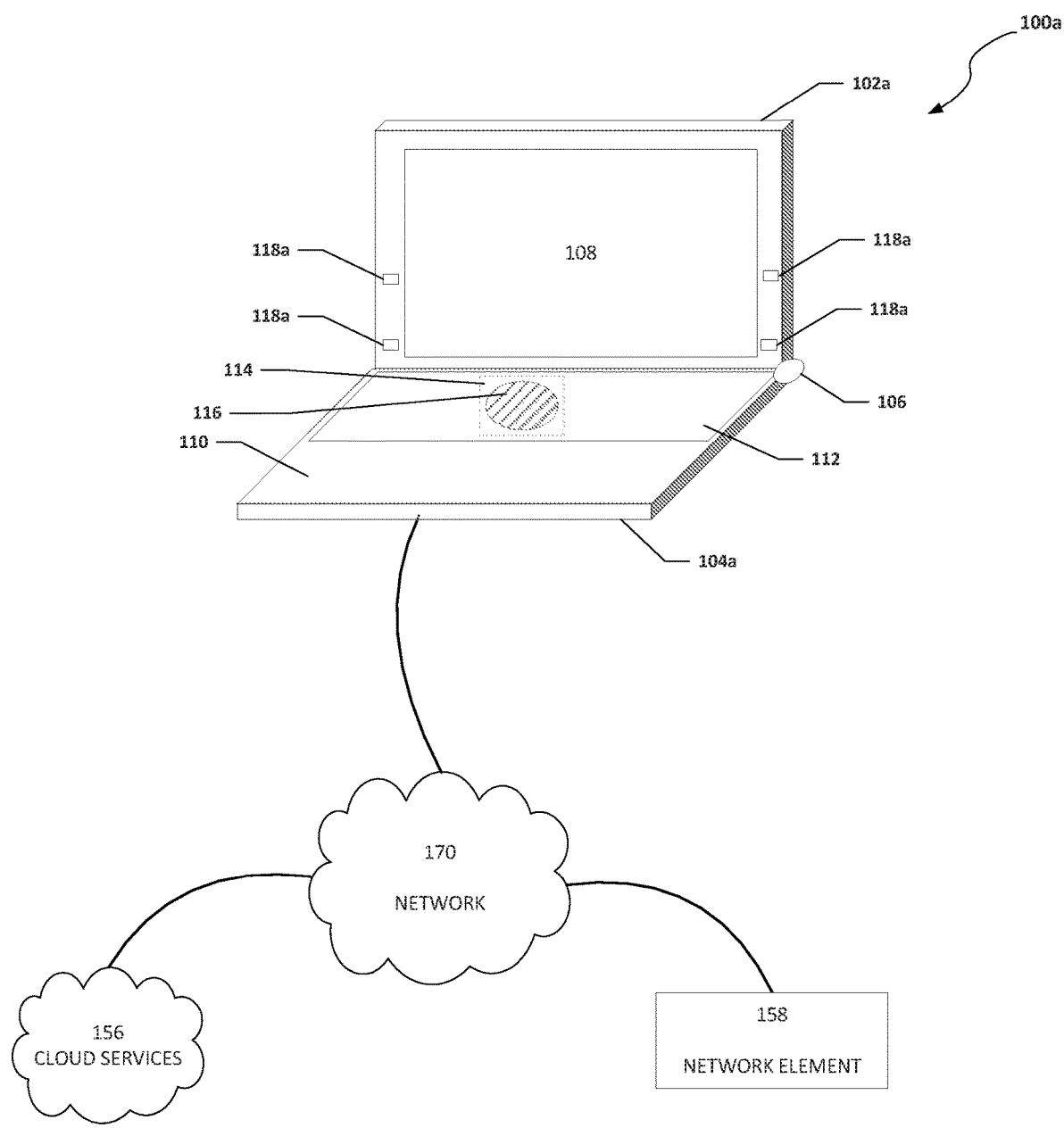
FIG. 10 is a simplified block diagram of an electronic device to enable a movable inlet for a fan, in accordance with an embodiment of the present disclosure.

Turning to FIG. 10, FIG. 10 is a simplified block diagram of electronic device 100a configured with a movable inlet for a fan, in accordance with an embodiment of the present disclosure. In an example, electronic device 100a can include first housing 102a and second housing 104a. First housing 102a can be rotatably coupled to second housing 104a using hinge 106. First housing 102a can include display 108 and tabs 118a. Second housing 104a can include keyboard portion 110, inlet portion 112, and fan 114. Inlet portion 112 can include inlet 116. Electronic device 100a may be in communication with cloud services 156, and/or network element 158 using network 170. In some examples, electronic device 100a may be a standalone device and not connected to network 170 or another device.

Elements of FIG. 10 may be coupled to one another through one or more interfaces employing any suitable connections (wired or wireless), which provide viable pathways for network (e.g., network 170, etc.) communications. Additionally, any one or more of these elements of FIG. 10 may be combined or removed from the architecture based on particular configuration needs. Electronic device 100a may include a configuration capable of transmission control protocol/Internet protocol (TCP/IP) communications for the transmission or reception of packets in a network. Electronic device 100a may also operate in conjunction with a user datagram protocol/IP (UDP/IP) or any other suitable protocol where appropriate and based on particular needs.

Turning to the infrastructure of FIG. 10, electronic device 100a in accordance with an example embodiment is shown. Generally, the system may be implemented in any type or topology of networks. Network 170 represents a series of points or nodes of interconnected communication paths for receiving and transmitting packets of information that propagate through the system. Network 170 offers a communicative interface between nodes, and may be configured as any local area network (LAN), virtual local area network (VLAN), wide area network (WAN), wireless local area network (WLAN), metropolitan area network (MAN), Intranet, Extranet, virtual private network (VPN), and any other appropriate architecture or system that facilitates communications in a network environment, or any suitable combination thereof, including wired and/or wireless communication.

In the system, network traffic, which is inclusive of packets, frames, signals, data, etc., can be sent and received according to any suitable communication messaging protocols. Suitable communication messaging protocols can include a multi-layered scheme such as Open Systems Interconnection (OSI) model, or any derivations or variants thereof (e.g., Transmission Control Protocol/Internet Protocol (TCP/IP), user datagram protocol/IP (UDP/IP)). Messages through the network could be made in accordance with various network protocols, (e.g., Ethernet, Infiniband, OmniPath, etc.). Additionally, radio signal communications over a cellular network may also be provided in the system. Suitable interfaces and infrastructure may be provided to enable communication with the cellular network.

The term "packet" as used herein, refers to a unit of data that can be routed between a source node and a destination node on a packet switched network. A packet includes a source network address and a destination network address. These network addresses can be Internet Protocol (IP) addresses in a TCP/IP messaging protocol. The term "data" as used herein, refers to any type of binary, numeric, voice, video, textual, or script data, or any type of source or object code, or any other suitable information in any appropriate format that may be communicated from one point to another in electronic devices and/or networks. The data may help determine a status of a network element or network. Additionally, messages, requests, responses, and queries are forms of network traffic, and therefore, may comprise packets, frames, signals, data, etc.

Figure 11:
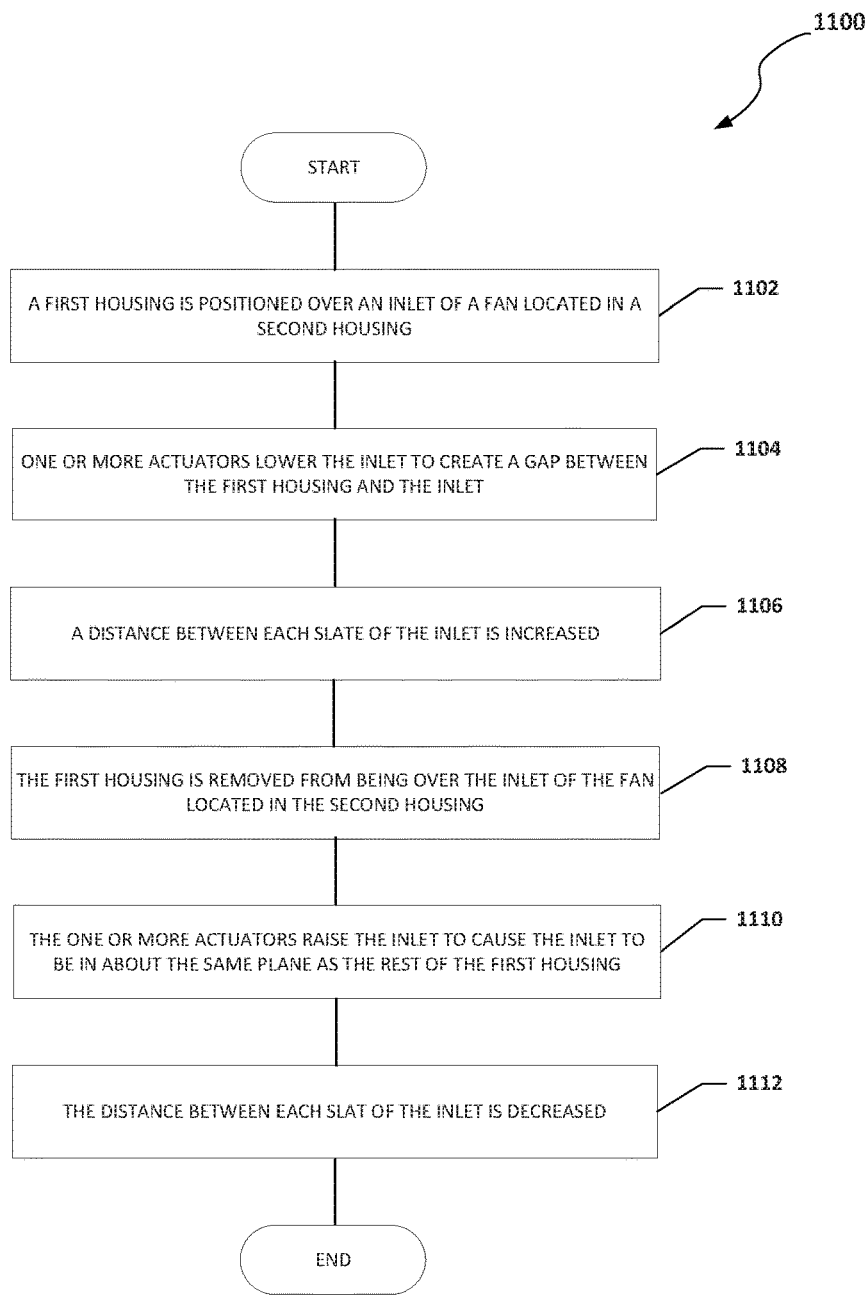
FIG. 11 is a simplified flowchart illustrating potential operations that may be associated with the system in accordance with an embodiment of the present disclosure.

Turning to FIG. 11, FIG. 11 is an example flowchart illustrating possible operations of a flow 1100 that may be associated with enabling a movable inlet for a fan, in accordance with an embodiment. In an embodiment, one or more operations of flow 1100 may be performed by inlet control engine 130 and/or inlet engine 160. At 1102, a first housing is positioned over an inlet of a fan located in a second housing. For example, when electronic device 100a is converted from an open configuration to a close configuration, first housing 102a can be over inlet 116 to fan 114 in second housing 104a. In another example, third housing 136 may be over inlet 116 to fan 114 in second housing 134. At 1104, one or more actuators lower the inlet to create a gap between the first housing and the inlet. For example, as first housing 102a is rotated towards second housing 104a, tabs 118a can come into contact with inlet portion 112 and create a downward force on inlet portion 112. The downward force on inlet portion 112 causes actuators 120 to compress and allow inlet portion 112 to move out of the plane of keyboard portion 110 and create gap 122 between inlet portion 112 and first housing 102a. In another example, inlet control engine 130 can cause actuators 120 to compress and allow inlet portion 112 to move out of the plane of keyboard portion 110 and create gap 122 between inlet portion 112 and first housing 102c. At 1106, a distance between each slat of the inlet is increased. For example, the distance between each slat in inlet 116 may be about one (1) millimeter (mm) or less when electronic device 100a is in an open configuration and when electronic device 100a is in a close configuration, the distance between each slat in inlet 116 may be greater than about one (1) millimeter (mm).

At 1108, the first housing is removed from being over the inlet of the fan located in the second housing. At 1110, the one or more actuators raise the inlet to cause the inlet to be in about the same plane as the rest of the first housing. At 1112, the distance between each slat of the inlet is decreased.

Figure 12:
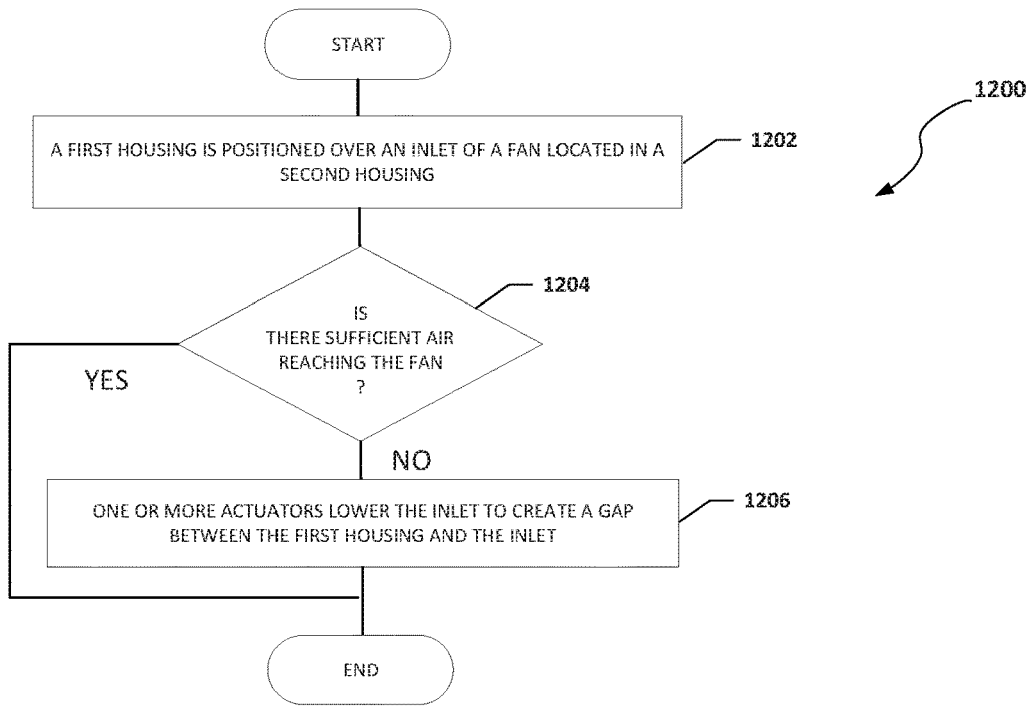
FIG. 12 is a simplified flowchart illustrating potential operations that may be associated with the system in accordance with an embodiment of the present disclosure.

Turning to FIG. 12, FIG. 12 is an example flowchart illustrating possible operations of a flow 1200 that may be associated with enabling a movable inlet for a fan, in accordance with an embodiment. In an embodiment, one or more operations of flow 1200 may be performed by inlet control engine 130 and/or inlet engine 160. At 1202, a first housing is positioned over an inlet of a fan located in a second housing. For example, when electronic device 100a is converted from an open configuration to a close configuration, first housing 102a can be over inlet 116 to fan 114 in second housing 104a. In another example, third housing 136 may be over inlet 116 to fan 114 in second housing 134. At 1204, the system determines if there is sufficient air reaching the fan. If there is not sufficient air reaching the fan, then one or more actuators lower the inlet to create a gap between the first housing and the inlet, as in 1206. For example, as first housing 102a is rotated towards second housing 104a, tabs 118a can come into contact with inlet portion 112 and create a downward force on inlet portion 112. The downward force on inlet portion 112 causes actuators 120 to compress and allow inlet portion 112 to move out of the plane of keyboard portion 110 and create gap 122 between inlet portion 112 and first housing 102a. In another example, inlet control engine 130 can cause actuators 120 to compress and allow inlet portion 112 to move out of the plane of keyboard portion 110 and create gap 122 between inlet portion 112 and first housing 102c. Gap 122 can allow more air to enter inlet 116 and reach fan 114. If there is sufficient air reaching the fan, then the process ends. For example, the electronic device may be in a low power mode or off and the fan may be idle or not operating.

Figure 13:
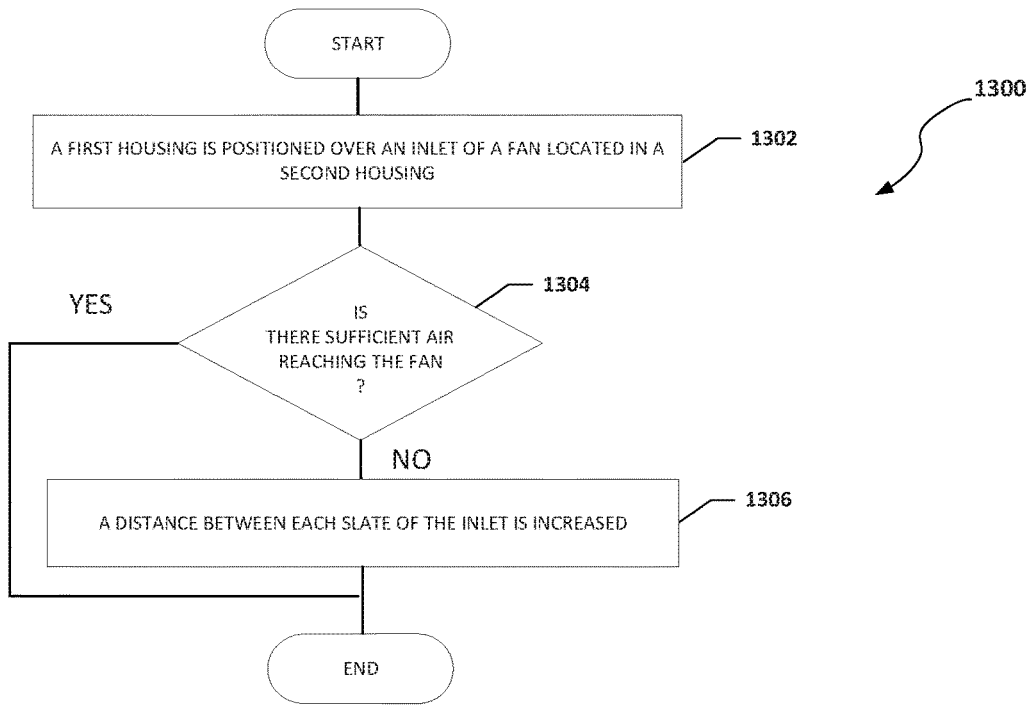
FIG. 13 is a simplified flowchart illustrating potential operations that may be associated with the system in accordance with an embodiment of the present disclosure.

Turning to FIG. 13, FIG. 13 is an example flowchart illustrating possible operations of a flow 1300 that may be associated with enabling a movable inlet for a fan, in accordance with an embodiment. In an embodiment, one or more operations of flow 1300 may be performed by inlet control engine 130 and/or inlet engine 160. At 1302, a first housing is positioned over an inlet of a fan located in a second housing. For example, when electronic device 100a is converted from an open configuration to a close configuration, first housing 102a can be over inlet 116 to fan 114 in second housing 104a. In another example, third housing 136 may be over inlet 116 to fan 114 in second housing 134. At 1304, the system determines if there is sufficient air reaching the fan. If there is not sufficient air reaching the fan, then a distance between each slat of the inlet is increased, as in 1306. For example, inlet engine 160 can cause the distance between each slat 124 of inlet 116 to increase and allow more air to enter inlet 116 and reach fan 114. In another example, inlet control engine 130 can cause the distance between each slat 124 of inlet 116 to increase or inlet control engine 130 can cause inlet engine 160 to increase in the distance between each slat 124 of inlet 116 and allow more air to enter inlet 116 and reach fan 114. If there is sufficient air reaching the fan, then the process ends. For example, the electronic device may be in a low power mode or off and the fan may be idle or not operating.

Figure 14:
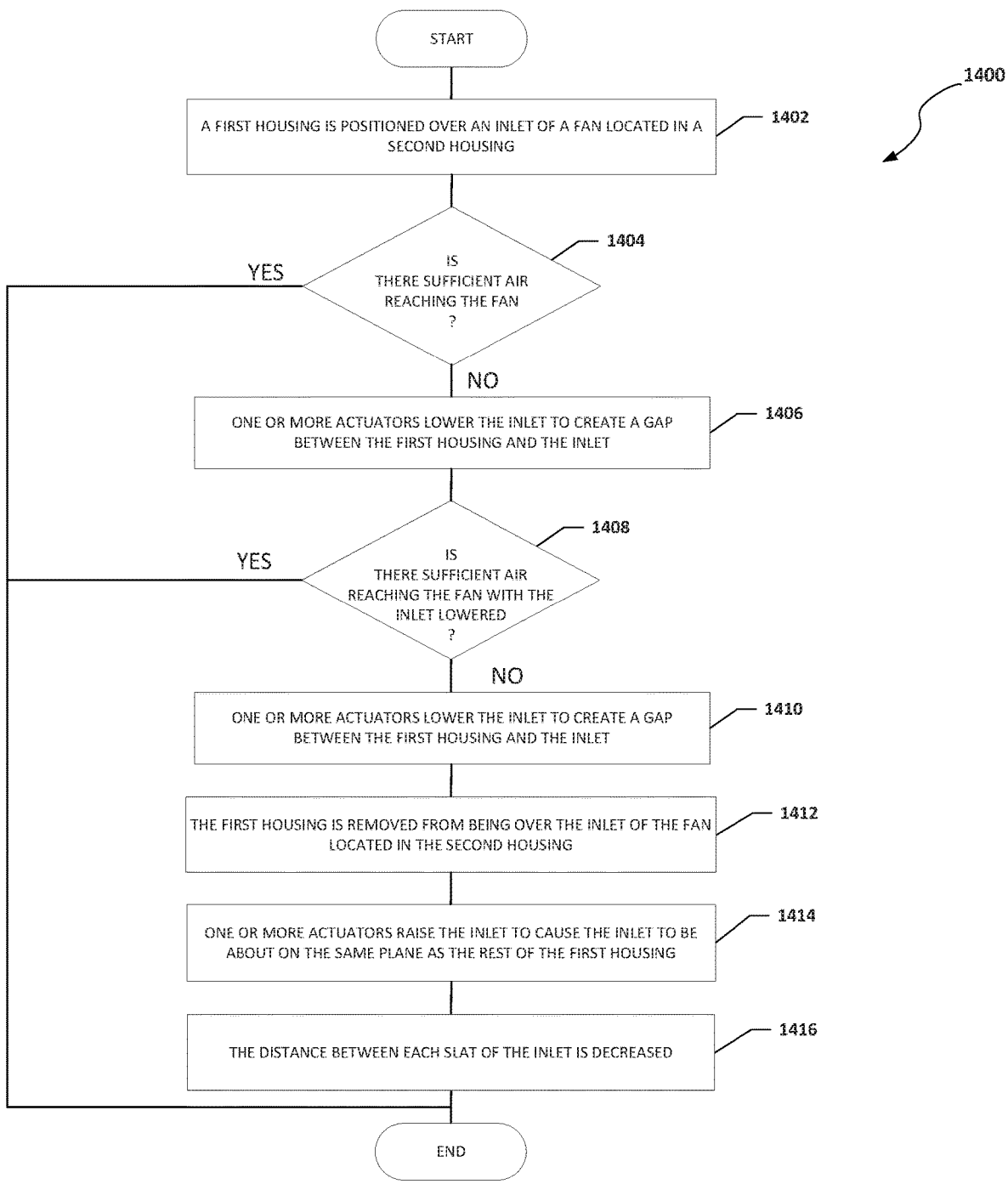
FIG. 14 is a simplified flowchart illustrating potential operations that may be associated with the system in accordance with an embodiment of the present disclosure.

Turning to FIG. 14, FIG. 14 is an example flowchart illustrating possible operations of a flow 1400 that may be associated with enabling a movable inlet for a fan, in accordance with an embodiment. In an embodiment, one or more operations of flow 1400 may be performed by inlet control engine 130 and/or inlet engine 160. At 1402, a first housing is positioned over an inlet of a fan located in a second housing. For example, when electronic device 100a is converted from an open configuration to a close configuration, first housing 102a can be over inlet 116 to fan 114 in second housing 104a. In another example, third housing 136 may be over inlet 116 to fan 114 in second housing 134. At 1404, the system determines if there is sufficient air reaching the fan. If there is not sufficient air reaching the fan, then one or more actuators lower the inlet to create a gap between the first housing and the inlet, as in 1406. For example, as first housing 102a is rotated towards second housing 104a, tabs 118a can come into contact with inlet portion 112 and create a downward force on inlet portion 112. The downward force on inlet portion 112 causes actuators 120 to compress and allow inlet portion 112 to move out of the plane of keyboard portion 110 and create gap 122 between inlet portion 112 and first housing 102a. In another example, inlet control engine 130 can cause actuators 120 to compress and allow inlet portion 112 to move out of the plane of keyboard portion 110 and create gap 122 between inlet portion 112 and first housing 102c. Gap 122 can allow more air to enter inlet 116 and reach fan 114. If there is sufficient air reaching the fan, then the process ends. For example, the electronic device may be in a low power mode or off and the fan may be idle or not operating.

At 1408, the system determines if there is sufficient air reaching the fan after the one or more actuators lower the inlet to create the gap between the first housing and the inlet. If there is not sufficient air reaching the fan after the one or more actuators lower the inlet to create the gap between the first housing and the inlet, then a distance between each slat of the inlet is increased, as in 1410. For example, inlet engine 160 can cause the distance between each slat 124 of inlet 116 to increase. The increase in the distance between each slat 124 of the inlet can allow more air to enter inlet 116 and reach fan 114. If there is sufficient air reaching the fan, then the process ends. At 1412, the first housing is removed from being over the inlet of the fan located in the second housing. At 1414, the one or more actuators raise the inlet to cause the inlet to be about on the same plane as the rest of the first housing. At 1416, the distance between each slat of the inlet is decreased.

It is also important to note that the operations in the preceding flow diagrams (i.e., FIGS. 11-14) illustrates only some of the possible correlating scenarios and patterns that may be executed by, or within, electronic devices 100a-100f. Some of these operations may be deleted or removed where appropriate, or these operations may be modified or changed considerably without departing from the scope of the present disclosure. In addition, a number of these operations have been described as being executed concurrently with, or in parallel to, one or more additional operations. However, the timing of these operations may be altered considerably. The preceding operational flows have been offered for purposes of example and discussion. Substantial flexibility is provided by electronic devices 100a-100f in that any suitable arrangements, chronologies, configurations, and timing mechanisms may be provided without departing from the teachings of the present disclosure.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. Additionally, although electronic devices 100a-100f have been illustrated with reference to particular elements and operations that facilitate the communication process, these elements and operations may be replaced by any suitable architecture, protocols, and/or processes that achieve the intended functionality of electronic devices 100a-100f.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

Other Notes and Examples

Example A1, is an electronic device including a first housing, a second housing, where the second housing includes a fan, an inlet, and actuators, and a hinge, where the hinge rotatably couples the first housing to the second housing, where when the first housing is rotated over the inlet, the actuators lower the inlet to create a gap between the inlet and the first housing.

In Example A2, the subject matter of Example A1 can optionally include where the inlet includes slats and when the first housing is rotated over the inlet, a distance between each of the slats increases from a first distance to a second distance.

In Example A3, the subject matter of any one of Examples A1-A2 can optionally include where the first distance is about one (1) millimeter or less.

In Example A4, the subject matter of any one of Examples A1-A3 can optionally include where the second distance is over about one (1) millimeter.

In Example A5, the subject matter of any one of Examples A1-A4 can optionally include where the first housing includes a display.

In Example A6, the subject matter of any one of Examples A1-A5 can optionally include where the first housing includes tabs and the tabs exert a force on the actuators to cause the actuators to lower the inlet to create the gap between the inlet and the first housing.

In Example A7, the subject matter of any one of Examples A1-A6 can optionally include where the fan is a dish fan.

Example S1 is a system for enabling a movable inlet for a fan. The system can include memory, a first housing, a second housing, where the second housing includes a fan, an inlet, and actuators, a hinge, where the hinge rotatably couples the first housing to the second housing, and an inlet control engine. The inlet control engine is configured to determine when the first housing is rotated over the inlet and cause the actuators to lower the inlet to create a gap between the inlet and the first housing.

In Example S2, the subject matter of Example S1 can optionally include where the inlet includes slats and when the inlet control engine determines the first housing is rotated over the inlet, the inlet control engine is configured to increase a distance between each of the slats from a first distance to a second distance.

In Example S3, the subject matter of any one of the Examples S1-S2 can optionally include where the first distance is about one (1) millimeter or less.

In Example S4, the subject matter of any one of the Examples S1-S3 can optionally include where the second distance is over about one (1) millimeter.

In Example S5, the subject matter of any one of the Examples S1-S4 can optionally include where the first housing includes a display.

In Example S6, the subject matter of any one of the Examples S1-S5 can optionally include where the fan is a dish fan.

Example M1 is a method including determining when a first housing is positioned (rotated) over an inlet in a second housing, where the inlet is an inlet to a fan located in the second housing and causing one or more actuators to lower the inlet to create a gap between the inlet and the first housing.

In Example M2, the subject matter of Example M1 can optionally include where the inlet includes slats and when the first housing is positioned (rotated) over the inlet, a distance between each of the slats increases from a first distance to a second distance.

In Example M3, the subject matter of any one of the Examples M1-M2 can optionally include where the first distance is about one (1) millimeter or less.

In Example M4, the subject matter of any one of the Examples M1-M3 can optionally include where the second distance is over about one (1) millimeter.

In Example M5, the subject matter of any one of the Examples M1-M4 can optionally include where the first housing includes a display.

In Example M6, the subject matter of any one of the Examples M1-M5 can optionally include where the first housing includes tabs and the tabs exert a force on the actuators and cause the actuators to lower the inlet to create the gap between the inlet and the first housing.

In Example M7, the subject matter of any one of the Examples M1-M6 can optionally include where the fan is a dish fan.

Example SS1 is a system for enabling a movable inlet for a fan. The system can include means for determining when a first housing is positioned/rotated over an inlet in a second housing, where the inlet is an inlet to a fan located in the second housing and means for causing one or more actuators to lower the inlet to create a gap between the inlet and the first housing.

In Example SS2, the subject matter of Example SS1 can optionally include where the inlet includes slats and when the first housing is positioned/rotated over the inlet, a distance between each of the slats increases from a first distance to a second distance.

In Example SS3, the subject matter of any one of the Examples SS1-SS2 can optionally include where the first distance is about one (1) millimeter or less.

In Example SS4, the subject matter of any one of the Examples SS1-SS3 can optionally include where the second distance is over about one (1) millimeter.

In Example SS5, the subject matter of any one of the Examples SS1-SS4 can optionally include where the first housing includes a display.

In Example SS6, the subject matter of any one of the Examples SS1-SS5 can optionally include where the first housing includes tabs and the tabs exert a force on the actuators and cause the actuators to lower the inlet to create the gap between the inlet and the first housing.

In Example SS7, the subject matter of any one of the Examples SS1-SS6 can optionally include where the fan is a dish fan.

What is claimed is:

1. An electronic device comprising:
 a first housing including one or more tabs;
 a second housing including a fan, an inlet, and actuators; and
 a hinge, wherein the hinge rotatably couples the first housing to the second housing, wherein when the first housing is rotated over the inlet, the one or more tabs exert a force on the actuators to lower the inlet and create a gap between the inlet and the first housing.

2. The electronic device of claim 1, wherein the inlet includes slats and when the first housing is rotated over the inlet, a distance between each of the slats increases from a first distance to a second distance.

3. The electronic device of claim 2, wherein the first distance is about one (1) millimeter or less.

4. The electronic device of claim 2, wherein the second distance is over about one (1) millimeter.

5. The electronic device of claim 1, wherein the first housing includes a display.

6. The electronic device of claim 1, wherein the fan is a dish fan.

7. A system for enabling a movable inlet for a fan, the system comprising:
 memory;
 a first housing that includes one or more tabs;
 a second housing that includes a fan, an inlet, and actuators, wherein the inlet includes slats;
 a hinge, wherein the hinge rotatably couples the first housing to the second housing, wherein when the first housing is rotated over the inlet, the one or more tabs exert a force on the actuators to lower the inlet and create a gap between the inlet and the first housing; and
 an inlet control engine, wherein the inlet control engine is configured to:
  increase a distance between each of the slats from a first distance to a second distance when the first housing is rotated over the inlet.

8. The system of claim 7, wherein the first distance is about one (1) millimeter or less.

9. The system of claim 7, wherein the second distance is over about one (1) millimeter.

10. The system of claim 7, wherein the first housing includes a display.

11. The system of claim 7, wherein the fan is a dish fan.

12. A method comprising:
 rotating a first housing that includes one or more tabs to a position over an inlet in a second housing that includes a fan, the inlet, and one or more actuators, wherein the inlet is an inlet to the fan; and
 causing the one or more tabs exert a force on the one or more actuators to lower the inlet and create a gap between the inlet and the first housing.

13. The method of claim 12, wherein the inlet includes slats and when the first housing is positioned over the inlet, a distance between each of the slats increases from a first distance to a second distance.

14. The method of claim 13, wherein the first distance is about one (1) millimeter or less.

15. The method of claim 13, wherein the second distance is over about one (1) millimeter.

16. The method of claim 12, wherein the first housing includes a display.

17. The method of claim 12, wherein the fan is a dish fan.

* * * * *